(12) United States Patent
Hino et al.

(10) Patent No.: US 9,553,228 B2
(45) Date of Patent: Jan. 24, 2017

(54) SOLAR CELL, PRODUCTION METHOD THEREFOR, AND SOLAR CELL MODULE

(71) Applicant: KANEKA CORPORATION, Osaka-shi, Osaka (JP)

(72) Inventors: Masashi Hino, Settsu (JP); Daisuke Adachi, Settsu (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 14/891,636

(22) PCT Filed: May 17, 2014

(86) PCT No.: PCT/JP2014/063130
§ 371 (c)(1),
(2) Date: Nov. 16, 2015

(87) PCT Pub. No.: WO2014/185537
PCT Pub. Date: Nov. 20, 2014

(65) Prior Publication Data
US 2016/0126399 A1   May 5, 2016

(30) Foreign Application Priority Data
May 17, 2013  (JP) .................................. 2013-105530

(51) Int. Cl.
*H01L 31/00* (2006.01)
*H01L 21/00* (2006.01)
(Continued)

(52) U.S. Cl.
CPC ..... *H01L 31/074* (2013.01); *H01L 31/022425* (2013.01); *H01L 31/022466* (2013.01);
(Continued)

(58) Field of Classification Search
CPC ................. H01L 31/022425; H01L 31/022433
See application file for complete search history.

(56) References Cited

U.S. PATENT DOCUMENTS

| 4,586,988 A | 5/1986 | Nath et al. |
| 5,296,043 A * | 3/1994 | Kawakami ........ H01L 31/02242 136/244 |

(Continued)

FOREIGN PATENT DOCUMENTS

| EP | 1883117 A2 | 1/2008 |
| EP | 2479802 A1 | 7/2012 |

(Continued)

OTHER PUBLICATIONS

English language machine translation for Masatomo et al. (JP 2012-099565 A), obtained on Jun. 27, 2016.*

(Continued)

*Primary Examiner* — Eli Mekhlin
(74) *Attorney, Agent, or Firm* — Alleman Hall McCoy Russell & Tuttle LLP

(57) ABSTRACT

A solar cell of the invention includes a collecting electrode on a first principal surface of a photoelectric conversion section. The collecting electrode includes a first electroconductive layer and a second electroconductive layer in this order from the photoelectric conversion section. On the first principal surface of the photoelectric conversion section, an insulating layer is provided in a first electroconductive layer-non-formed region where the first electroconductive layer is not formed. The insulating layer includes a first insulating layer that is in contact with the first electroconductive layer on the first principal surface of the photoelectric conversion section, and a second insulating layer that is formed so as to cover at least a part of the first insulating layer.

9 Claims, 7 Drawing Sheets

(51) Int. Cl.
*H01L 31/074* (2012.01)
*H01L 31/0224* (2006.01)
*H01L 31/0747* (2012.01)
*H01L 31/18* (2006.01)

(52) U.S. Cl.
CPC ...... *H01L 31/0747* (2013.01); *H01L 31/1884* (2013.01); *Y02E 10/50* (2013.01)

(56) References Cited

U.S. PATENT DOCUMENTS

| | | | | |
|---|---|---|---|---|
| 6,210,805 | B1* | 4/2001 | Sunahara | C03C 17/3411 428/425.6 |
| 2003/0221718 | A1* | 12/2003 | Kubo | H01L 31/02242 136/256 |
| 2008/0011350 | A1* | 1/2008 | Luch | H01L 31/02242 136/249 |
| 2009/0032081 | A1* | 2/2009 | Saita | H01L 31/02242 136/244 |
| 2009/0056803 | A1 | 3/2009 | Nakai et al. | |
| 2010/0154869 | A1* | 6/2010 | Oh | H01L 31/02242 136/252 |
| 2011/0049439 | A1* | 3/2011 | Higuchi | H01B 1/22 252/512 |
| 2011/0140226 | A1* | 6/2011 | Jin | H01L 31/02168 257/460 |
| 2011/0192457 | A1 | 8/2011 | Nakayama et al. | |
| 2012/0097244 | A1* | 4/2012 | Adachi | H01L 31/02248 136/256 |
| 2012/0240998 | A1 | 9/2012 | Ballif | |
| 2012/0291844 | A1 | 11/2012 | Tsuge | |
| 2013/0112234 | A1 | 5/2013 | Ishii | |
| 2013/0167923 | A1 | 7/2013 | Nakamura et al. | |
| 2013/0284263 | A1* | 10/2013 | Mitta | H01L 31/02242 136/256 |
| 2013/0312827 | A1 | 11/2013 | Adachi et al. | |

FOREIGN PATENT DOCUMENTS

| | | | | |
|---|---|---|---|---|
| JP | | S6066426 A | 4/1985 | |
| JP | | 2000058885 A | 2/2000 | |
| JP | | 2002076398 A | 3/2002 | |
| JP | | 2005243872 A | 9/2005 | |
| JP | | 200954748 A | 3/2009 | |
| JP | | 2010098232 A | 4/2010 | |
| JP | | 2011199045 A | 10/2011 | |
| JP | | 201215269 A | 1/2012 | |
| JP | | 201284585 A | 4/2012 | |
| JP | | 2012099565 A | 5/2012 | |
| JP | | 2013507781 A | 3/2013 | |
| WO | | 2010016186 A1 | 2/2010 | |
| WO | | 2011045287 A1 | 4/2011 | |
| WO | WO | 2012086701 A1 * | 6/2012 | ..... H01L 31/022425 |
| WO | | 2013077038 A1 | 5/2013 | |

OTHER PUBLICATIONS

ISA Japanese Patent Office, International Search Report Issued in Application No. PCT/JP2014/063130, Jul. 15, 2014, WIPO, 4 pages.
European Patent Office, Extended European Search Report Issued in Application No. 14797835.7, Apr. 21, 2016, Germany, 10 pages.

* cited by examiner

SOLAR CELL, PRODUCTION METHOD THEREFOR, AND SOLAR CELL MODULE

TECHNICAL FIELD

The present invention relates to a solar cell and a production method thereof. Further, the present invention relates to a solar cell module.

BACKGROUND ART

Since energy issues and global environmental issues are becoming more serious, solar cells are receiving more attention as an alternative energy source for replacing fossil fuels. In the solar cell, carriers (electrons and holes) generated by light irradiation to a photoelectric conversion section composed of a semiconductor junction or the like are extracted to an external circuit to generate electricity. A collecting electrode is provided on the photoelectric conversion section of the solar cell for efficiently extracting carriers generated at the photoelectric conversion section to the external circuit.

For example, in a crystalline silicon-based solar cell using a single-crystalline silicon substrate or a polycrystalline silicon substrate, a collecting electrode made of fine metal is provided on a light-receiving surface. Also, in a heterojunction solar cell having amorphous silicon layers and transparent electrode layers on a crystalline silicon substrate, collecting electrode(s) are provided on the transparent electrode layer(s).

The collecting electrode of the solar cell is generally formed by pattern-printing a silver paste by a screen printing method. This method is simple in terms of the process itself, but has such a problem that the material cost of silver is high, but the resistance of the collecting electrode increases when a silver paste material containing a resin is used. For decreasing the resistivity of the collecting electrode formed of a silver paste, it is necessary to thickly print the silver paste. However, since the line width of the electrode increases with the increase of the print thickness, thinning of the electrode is difficult, and the shading area of the collecting electrode increases.

For solving these problems, a method is known in which a collecting electrode is formed by a plating method excellent in terms of material and process costs. For example, Patent Document 1 discloses a solar cell in which a metallic layer made of copper or the like is formed by a plating method on a transparent electrode that forms a photoelectric conversion section. In this method, first, a resist material layer (insulating layer) having an opening section matching the shape of a collecting electrode is formed on the transparent electrode layer of the photoelectric conversion section, and then a metallic layer is formed at the resist opening section on the transparent electrode layer by electroplating. Thereafter, the resist is removed to form a collecting electrode having a predetermined shape.

Patent Document 2 discloses that the need for resist removal after formation of a collecting electrode can be eliminated when a resist material layer (insulating layer) having an opening section matching the shape of the collecting electrode is formed on the transparent electrode layer of the photoelectric conversion section, and a material used for the resist material layer has a refractive index nearly equal to that of glass. Patent Document 3 discloses that the line width of a plating electrode is made equal to or less than that of an under-layer electrode by forming the plating electrode layer using a mask after a formation of the under (seed) electrode layer made of electroconductive paste or the like.

Patent Document 4 discloses a method in which an insulating layer of $SiO_2$ or the like is provided on a transparent electrode layer, a groove extending through the insulating layer is then formed to expose the surface or side surface of the transparent electrode layer, and a metal collecting electrode is formed so as to be in conduction with an exposed area of the transparent electrode. Specifically, a method is proposed in which a metal seed is formed on the exposed area of the transparent electrode layer by a light induced plating method or the like, and a metal electrode is formed by electroplating with the metal seed as an origination point. This method is more advantageous in terms of material costs and process costs because it is not necessary to use a resist, unlike Patent Documents 1 and 2. By providing a low-resistance metal seed, the contact resistance between a transparent electrode layer and a collecting electrode can be lowered.

Patent Document 5 discloses a method in which an insulating layer is formed on an electroconductive seed having large unevenness to generate discontinuous opening sections in the insulating layer on the electroconductive seed, and a plating electrode layer is formed via the opening sections.

PRIOR ART DOCUMENTS

Patent Documents

Patent Document 1: JP 60-66426
Patent Document 2: JP-A 2000-58885
Patent Document 3: JP-A 2010-98232
Patent Document 4: JP-A 2011-199045
Patent Document 5: WO2011/045287

SUMMARY OF THE INVENTION

Problems to be Solved by the Invention

When a collecting electrode of a thin line pattern is formed by using a resist material, as disclosed in Patent Document 1, there is a problem that production costs are increased because the resist material is expensive and the process for forming the electrodes is complicated due to seed electrode layer formation and a resist removal. When a resist material having a refractive index substantially equal to that of glass is used, as described in Patent Document 2, a resist removing step can be omitted. However, a transparent electrode layer has a resistivity higher than that of a metal, and therefore when a patterned collecting electrode including a metal electrode layer is formed, without seed electrode layer, on the transparent electrode layer by electroplating, there is a problem that the collecting electrode (metal electrode layer) has an uneven thickness due to a voltage drop in a surface of the transparent electrode layer. When a mask having an opening shape corresponding to a collecting electrode pattern is used, as described in Patent Document 3, it is very difficult to accurately register the mask during formation of an insulating layer and a screen plate during formation of a collecting electrode in an opening section of the insulating layer.

According to a method in which plating is performed using as an origination point the inside of a groove extending through an insulating layer and a transparent electrode layer, as described in Patent Document 4, a collecting electrode of a thin line pattern can be formed by a plating method without using an expensive resist material. However, the transparent electrode layer generally has a thickness of about 100 nm, and a contact area between a side surface of the transparent electrode layer and a metal collecting electrode is small. Therefore, there is a problem that a contact resistance between a transparent electrode and a collecting electrode increases, so that a function as a collecting electrode cannot be sufficiently exhibited.

In Patent Document 5, a metal electrode layer is formed via an opening section of an insulating layer on an electroconductive seed by plating. As a result of studies by the inventors herein, it has become evident that in the vicinity of an electroconductive seed-formed region, particularly in the vicinity of the outer edge of the electroconductive seed-formed region, the thickness of the insulating layer is smaller as compared to other regions, and therefore pinholes etc. easily occur. When a plating solution corrodes a transparent electroconductive layer immediately below the electroconductive seed through the pinholes, the electroconductive seed is easily peeled from a transparent electrode layer, so that the characteristics (particularly a fill factor) of a solar cell are deteriorated.

An object of the present invention is improving conversion efficiency of the solar cell and reduce production costs of the solar cell by solving problems of the prior art associated with formation of a collecting electrode of the solar cell by a plating method as described above.

Means for Solving the Problems

As a result of conducting vigorous studies in view of the above-mentioned problems, the inventors herein have found that when an insulating layer in the vicinity of a first electroconductive layer (seed layer) is made to have a two-layer structure, and a second electroconductive layer (metal electrode) is formed on the first electroconductive layer by a plating method, conversion efficiency of a solar cell can be improved, and further a collecting electrode having such a configuration can be formed at low costs, leading to the present invention.

The present invention relates to a solar cell including a photoelectric conversion section and a collecting electrode on a first principal surface of the photoelectric conversion section, production method thereof and a solar cell module including the solar cell. The collecting electrode includes a first electroconductive layer and a second electroconductive layer in this order from the photoelectric conversion section side. The first electroconductive layer is preferably formed by coating an electroconductive paste, and the second electroconductive layer is preferably formed by plating.

A solar cell of the present invention has an insulating layer on a first electroconductive layer-non-formed region on a first principal surface of a photoelectric conversion section. The insulating layer includes a first insulating layer that is in contact with a first electroconductive layer on the first principal surface of the photoelectric conversion section; and a second insulating layer that covers at least a part of the first insulating layer. Preferably, the second insulating layer is formed on substantially the entire surface of the first electroconductive layer-non-formed region on the first principal surface of the photoelectric conversion section.

The first electroconductive layer of the collecting electrode preferably includes electroconductive fine particles and an insulating material. Preferably, the first insulating layer is formed of a material identical to an insulating material contained in the first electroconductive layer. For example, from an electroconductive paste coating region containing electroconductive fine particles and an insulating material, the insulating material is exuded (wet-spread) onto the photoelectric conversion section to form a coating layer consisting of a first electroconductive layer containing electroconductive fine particles and an insulating material, and a first insulating layer that is in contact with the outer edge of the first electroconductive layer. The width from a boundary between the first electroconductive layer and the first insulating layer to an end of the first insulating layer on the first principal surface of the photoelectric conversion section is preferably 0.2 to 1.0 mm.

In one embodiment of the present invention, a second insulating layer having an opening section is formed on at least a part of the first electroconductive layer. For example, a second insulating layer having a predetermined shaped opening section can be formed by a printing method or the like. Further, a second insulating layer having predetermined shaped opening section can be formed by performing deposition while covering the first electroconductive layer with a mask or the like. With the opening section as an origination point, a metal can be deposited by plating, and a second electroconductive layer conductively connected to the first electroconductive layer through the opening section of the second insulating layer can be formed.

In one embodiment of the present invention, an opening is formed in the second insulating layer on the first electroconductive layer. With the opening section as an origination point, a metal can be deposited by plating, and a second electroconductive layer conductively connected to the first electroconductive layer through the opening of the second insulating layer can be formed. For example, when a low-melting-point material contained in the first electroconductive layer is heated (annealed) at a temperature of not lower than a thermal-fluidization onset temperature $T_1$ of the low-melting-point material to change a surface shape of the first electroconductive layer, an opening can be formed in the second insulating layer formed on the first electroconductive layer. In such an embodiment, the thermal-fluidization onset temperature $T_1$ of the low-melting-point material in the first electroconductive layer is preferably lower than the heat-resistant temperature of the photoelectric conversion section.

In one embodiment of the solar cell of the present invention, the photoelectric conversion section includes a silicon-based thin-film and a transparent electrode layer in this order on a first principal surface of a crystalline silicon substrate, and the collecting electrode is provided on the transparent electrode layer.

Effects of the Invention

According to the present invention, a collecting electrode can be formed by a plating method, and therefore the collecting electrode is made less resistive, so that conversion efficiency of a solar cell can be improved. Since the first insulating layer is provided in contact with the first electroconductive layer, a patterned electrode can be formed by a plating method even though strict registration for pattern formation is not performed during formation of the second insulating layer. Since the insulating layer in the vicinity of the first electroconductive layer has a two-layer structure, penetration of a plating solution into the photoelectric conversion section in the vicinity of the collecting electrode-formed region is suppressed, so that peeling of the collecting electrode from the photoelectric conversion section is suppressed. Thus, according to the present invention, a solar cell with improved efficiency and reliability can be provided at low cost.

DESCRIPTION OF EMBODIMENTS

Figure 1A:
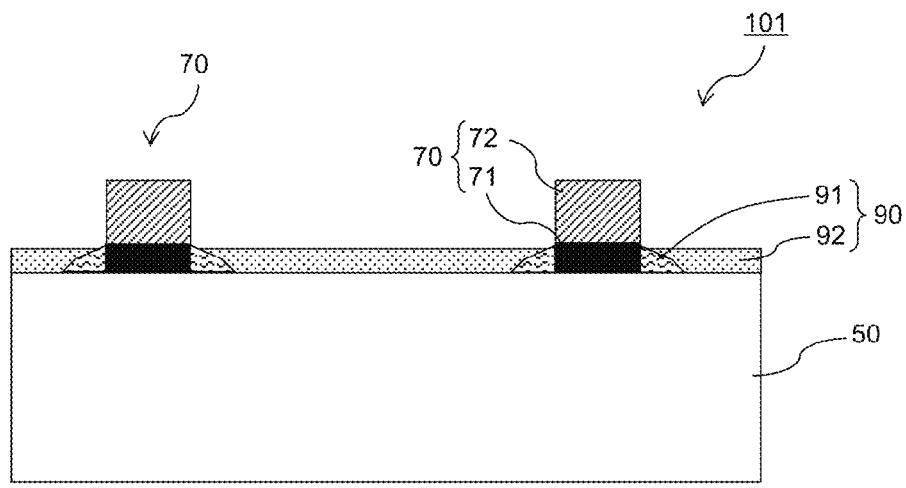
FIG. 1A is a schematic sectional view showing a solar cell according to one embodiment of the present invention.
Figure 1B:
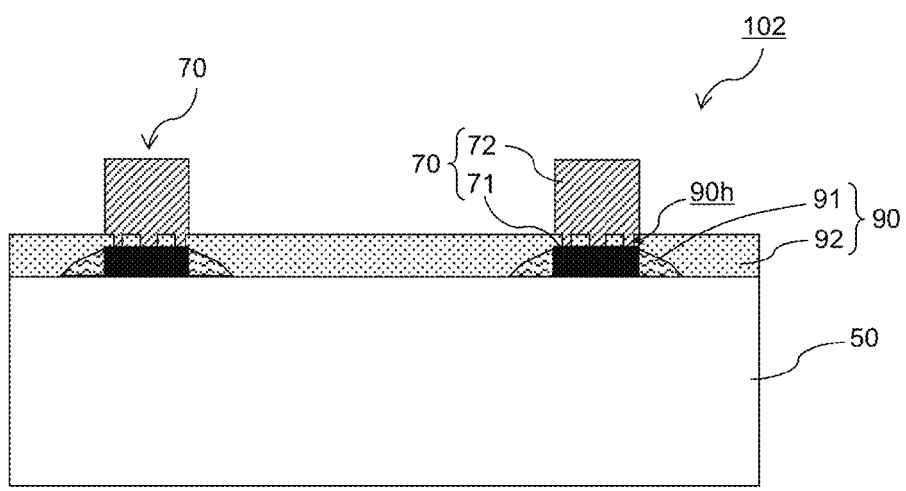
FIG. 1B is a schematic sectional view showing a solar cell according to one embodiment of the present invention.

Preferred embodiments of a present invention will be described below based on the drawings. As schematically shown in FIGS. 1A and 1B, the solar cell of the present invention includes a collecting electrode 70 on a first principal surface of a photoelectric conversion section 50. The collecting electrode 70 includes a first electroconductive layer 71 and a second electroconductive layer 72 in this order from the photoelectric conversion section 50 side.

The solar cell of the present invention includes an insulating layer 90 in at least a part of a region where the first electroconductive layer is not formed (herein, the "first electroconductive layer-non-formed region") on the first principal surface of the photoelectric conversion section. The insulating layer 90 includes a first insulating layer 91 that is in contact with the first electroconductive layer 71 and a second insulating layer 92 formed so as to cover at least a part of the first insulating layer 91.

The present invention will be described more in detail below taking as an example a heterojunction crystalline silicon solar cell (herein a "heterojunction solar cell" in some cases) as one embodiment of the present invention. The heterojunction solar cell is a crystalline silicon-based solar cell in which a silicon-based thin-film having a band gap different from that of single-crystalline silicon is formed on a surface of a single-crystalline silicon substrate, to produce a diffusion potential. The silicon-based thin-film preferably amorphous. Above all, a heterojunction solar cell having a thin intrinsic amorphous silicon layer interposed between a conductive amorphous silicon-based thin-film for forming a diffusion potential and a crystalline silicon substrate is one configuration of crystalline silicon solar cell with high conversion efficiency.

Figure 2:
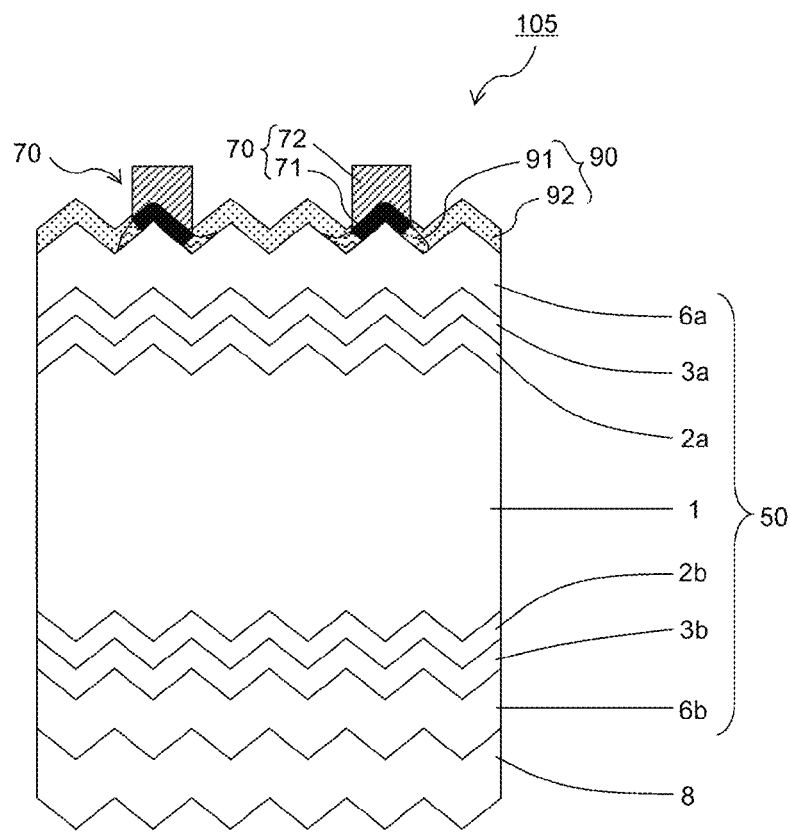
FIG. 2 is a schematic sectional view showing a heterojunction solar cell according to one embodiment of the present invention.

FIG. 2 is a schematic sectional view of a heterojunction solar cell according to one embodiment of the present invention. A heterojunction solar cell 105 includes, as a photoelectric conversion section 50, a conductive silicon-based thin-film 3a and a light-receiving side transparent electrode layer 6a in this order on the first principal surface (light-receiving surface) of a single-crystalline silicon substrate 1. A conductive silicon-based thin-film 3b and a back side transparent electrode layer 6b are provided in this order on the second principal surface (surface opposite to the light-receiving surface) of the single-crystalline silicon substrate 1. On the light-receiving side transparent electrode layer 6a of the photoelectric conversion section 50, a collecting electrode 70 including a first electroconductive layer 71 and a second electroconductive layer 72 is formed.

Intrinsic silicon-based thin-films 2a and 2b are preferably provided between the single-crystalline silicon substrate 1 and the conductive silicon-based thin-films 3a and 3b. A back side metal electrode 8 is preferably provided on the back side transparent electrode layer 6b.

[Configuration of Photoelectric Conversion Section]

First, the single-crystalline silicon substrate of the first conductivity type used in the heterojunction solar cell will be described. Generally, the single-crystalline silicon substrate contains impurities that supply charges to silicon for imparting conductivity. The single-crystalline silicon substrate is classified as an n-type which contains atoms for introducing electrons into silicon atoms (e.g., phosphorus) or a p-type which contains atoms for introducing holes into silicon atoms (e.g., boron). That is, the "first conductivity type" in the present invention means one of the n-type or the p-type.

In a heterojunction solar cell, electron/hole pairs can be efficiently separated and collected by setting a reverse junction as a heterojunction on the incident side at which light incident to the single-crystalline silicon substrate is absorbed most, thereby providing a strong electric field. Therefore, the heterojunction on the light-receiving side is preferably a reverse junction. When holes and electrons are compared, electrons, which are smaller in effective mass and scattering cross section, are generally larger in mobility. Accordingly, it is preferred that the crystalline silicon substrate 1 used in a heterojunction solar cell is an n-type single-crystalline silicon substrate. In order to enhance a light confinement, the single-crystalline silicon substrate 1 preferably has textured structure in its surface.

A silicon-based thin-film is formed on the surface of the single-crystalline silicon substrate on which a texture is formed. The method for forming these silicon-based thin-films is preferably plasma-enhanced chemical vapor deposition (CVD). Conditions used for forming the silicon-based thin-films by the plasma-enhanced CVD method are preferably as follows: a substrate temperature of 100 to 300° C., a pressure of 20 to 2600 Pa, and a high-frequency power density of 0.004 to 0.8 W/cm$^2$. A source gas used to form the silicon-based thin-films may be a silicon-containing gas such as $SiH_4$ or $Si_2H_6$, or a mixed gas of silicon-based gas and $H_2$.

The conductive silicon-based thin-films 3a and 3b are silicon-based thin-film of the first conductivity type or an opposite conductivity type. For example, when an n-type single-crystalline silicon substrate is used as the single-crystalline silicon substrate 1 of the first conductivity type, the silicon-based thin-film of the first conductivity type and the silicon-based thin-film of the opposite conductivity type are n- and p-types, respectively. A dopant gas preferably used for forming the p-type or the n-type silicon-based thin-film is $B_2H_6$ or $PH_3$, for example. The amount of impurity such as P or B added is sufficient to be a trace amount; thus, it is preferred to use a mixed gas diluted with $SiH_4$ or $H_2$ beforehand. When a gas containing a different element, such as $CH_4$, $CO_2$, $NH_3$ or $GeH_4$, is added thereto, silicon is alloyed so that the energy gaps of the conductive silicon-based thin-films can be changed.

Examples of the silicon-based thin-film include an amorphous silicon thin-film and microcrystalline silicon (a thin-film including amorphous silicon and crystalline silicon). Among them, an amorphous silicon-based thin-film is preferably used. When an n-type single-crystalline silicon substrate is used as the single-crystalline silicon substrate 1 of the first conductivity type, examples of the preferred structure of the photoelectric conversion section 50 include a stacked structure in the order of: transparent electrode layer 6a/p-type amorphous silicon-based thin-film 3a/i-type amorphous silicon-based thin-film 2a/n-type single-crystalline silicon substrate 1/i-type amorphous silicon-based thin-film 2b/n-type amorphous silicon-based thin-film 3b/transparent electrode layer 6b. In this case, for the aforementioned reason, the light-receiving surface is preferably on the p layer side.

The intrinsic silicon-based thin-films 2a and 2b are preferably i-type hydrogenated amorphous silicon composed of silicon and hydrogen. When i-type hydrogenated amorphous silicon is formed on a single-crystalline silicon substrate by a CVD method, surface passivation can be effectively performed while suppressing diffusion of impurities to the single-crystalline silicon substrate. When the amount of hydrogen in the film is changed along the thickness direction, the layer may have an energy gap profile effective for collecting carriers.

The p-type silicon-based thin-film is preferably a p-type hydrogenated amorphous silicon layer, a p-type amorphous silicon carbide layer or a p-type amorphous silicon oxide layer. The p-type hydrogenated amorphous silicon layer is preferable for suppressing impurity diffusion and reducing series resistance. On the other hand, the p-type amorphous silicon carbide layer and the p-type amorphous silicon oxide layer are wide-gap low-refractive index layers, and therefore preferable in the sense that the optical loss can be reduced.

The photoelectric conversion section 50 of the heterojunction solar cell includes transparent electrode layers 6a and 6b on the conductive silicon-based thin-films 3a and 3b. The transparent electrode layers 6a and 6b have a conductive oxide as a main component. As the conductive oxide, for example, zinc oxide, indium oxide and tin oxide may be used alone or in mixtures thereof. From the viewpoints of electroconductivity, optical characteristics and long-term reliability, indium-based oxides including indium oxide are preferable. Among them, those having indium tin oxide (ITO) as a main component are more suitably used. The transparent electrode layer may be a single layer or a layered structure composed of multiple layers.

Here, the wording "as a main component" in this specification means that the content is more than 50% by weight, preferably 70% by weight or more, more preferably 90% by weight or more.

A dopant can be added to the transparent electrode layer. For example, when zinc oxide is used for the transparent electrode layer, examples of the dopant include aluminum, gallium, boron, silicon and carbon. When indium oxide is used for the transparent electrode layer, examples of the dopant include zinc, tin, titanium, tungsten, molybdenum and silicon. When tin oxide is used for the transparent electrode layer, examples of the dopant include fluorine.

The dopant can be added to one or both of the light-receiving side transparent electrode layer 6a and the back side transparent electrode layer 6b. In particular, the dopant is preferably added to the light-receiving side transparent electrode layer 6a. By adding the dopant to the light-receiving side transparent electrode layer 6a, the transparent electrode layer itself is made less resistance, and the loss caused by the resistance between the transparent electrode layer 6a and the collecting electrode 70 can be suppressed.

The thickness of the light-receiving side transparent electrode layer 6a is preferably set to 10 nm or more and 140 nm or less, from the viewpoints of transparency, electroconductivity and reduction of light reflection. The role of the transparent electrode layer 6a is to transport carriers to the collecting electrode 70, and it suffices that the transparent electrode layer 6a has a level of electroconductivity required for this purpose, and the thickness of the transparent electrode layer 6a is preferably 10 nm or more. By ensuring that the thickness is 140 nm or less, the absorption loss at the transparent electrode layer 6a is kept low, so that a reduction in photoelectric conversion efficiency associated with a reduction in transmittance can be suppressed. When the thickness of the transparent electrode layer 6a falls within the aforementioned range, an increase in carrier concentration within the transparent electrode layer can also be prevented, and therefore a reduction in photoelectric conversion efficiency associated with a reduction in transmittance in an infrared range is also suppressed.

The method for forming a transparent electrode layer is not particularly limited. A physical vapor deposition method such as a sputtering method, a chemical vapor deposition method utilizing a reaction of an organic metal compound with oxygen or water (MOCVD), or the like is preferable. In any formation methods, energy from heat or plasma discharge may be utilized.

The substrate temperature during the formation of the transparent electrode layer may appropriately set. For example, when an amorphous silicon-based thin-film is used as a silicon-based thin-film, the substrate temperature is preferably 200° C. or lower. By ensuring that the substrate temperature is 200° C. or lower, desorption of hydrogen from the amorphous silicon layer and associated generation of a dangling bond to a silicon atom can be suppressed, and as a result, conversion efficiency can be improved.

A back side metal electrode 8 is preferably formed on the back side transparent electrode layer 6b. For the back side metal electrode 8, it is desirable to use a material having a high reflectivity in a near-infrared to infrared range, and having high electroconductivity and chemical stability. Examples of the material satisfying these characteristics include silver and aluminum. The method for forming a back side metal electrode layer is not particularly limited, and a physical vapor deposition method such as a sputtering method or a vacuum vapor deposition method, a printing method such as screen printing, or the like is applicable.

[Collecting Electrode]

A collecting electrode 70 is formed on the light-receiving side transparent electrode layer 6a. The collecting electrode 70 includes a first electroconductive layer 71 and a second electroconductive layer 72 from the photoelectric conversion section 50 side. The second electroconductive layer 72 is formed by a plating method.

(First Electroconductive Layer)

The first electroconductive layer 71 is a layer that functions as an electroconductive underlying layer when the second electroconductive layer is formed by a plating method. Therefore, it suffices that the first electroconductive layer has such a level of electroconductivity that it can function as an underlying layer for electroplating. In this specification, those having a volume resistivity of $10^{-2}$ Ω·cm or less are defined as being electroconductive. Those having a volume resistivity of $10^{2}$ Ω·cm or more are defined as insulating.

The first electroconductive layer 71 can be prepared by a known technique such as an inkjet method, a screen printing method, a conductor wire bonding method, a spray method, a vacuum deposition method, or a sputtering method. The first electroconductive layer 71 is preferably patterned in a specific shape such as a comb-like pattern. For formation of the patterned first electroconductive layer, the screen printing method is suitable to increase productivity. For the screen printing method, a method is suitably used in which a collecting electrode pattern is printed using a electroconductive printing paste and a screen plate having an opening pattern matching the pattern shape of the collecting electrode.

The first electroconductive layer 71 is preferably formed by using an electroconductive paste including electroconductive fine particles and an insulating material. As the insulating material, binder resin or the like can be used. Particularly, when the insulating material contained in the first electroconductive layer forming material exudes to form the first insulating layer as described later, it is preferred to use a binder resin as the insulating material.

As the binder resin, epoxy-based resin, thermoset resins such as phenol-based resin, acryl-based resin are preferably used. These resins may be solid state resin or liquid resin. The electroconductive paste may include an organic solvent or an inorganic solvent. When the electroconductive paste includes a liquid material such as a liquid resin or an organic solvent, a coating property (printing property) may be improved.

As the electroconductive fine particles, single metallic material such as silver, aluminum, copper, indium, bismuth, gallium or the like, or plural kinds of metallic materials may be used. A particle size of the electroconductive fine particle 710 is preferably 0.25 μm or more, more preferably 0.5 μm or more. When the first electroconductive layer 71 is formed by a printing method such as screen printing, the particle size of the electroconductive fine particles can be appropriately set according to, for example, the mesh size of a screen plate. For example, the particle size is preferably smaller than the mesh size, more preferably no more than ½ of the mesh size. When particles are non-spherical, the particle size is defined by the diameter of a circle having an area equal to the projected area of particles (i.e., projected area-circle equivalent diameter, Heywood diameter).

It is desirable to cure the resin material by a heat treatment for sufficiently improving electroconductivity of the first electroconductive layer formed by screen printing. For example, the first electroconductive layer is formed by curing an electroconductive paste containing electroconductive fine particles and an insulating material. When a material containing a solvent is used as an electroconductive paste, it is preferred to carry out a drying step for removing the solvent. The drying temperature in this case is preferably 250° C. or lower, more preferably 200° C. or lower, further preferably 180° C. or lower in view of heat resistance of the transparent electrode layer of the photoelectric conversion section and the amorphous silicon-based thin-film. The drying time can be appropriately set to, for example, about 5 minutes to 1 hour.

The thickness of the first electroconductive layer 71 is preferably 20 μm or less, more preferably 10 μm or less, due to cost, etc. On the other hand, the thickness of the first electroconductive layer 71 is preferably 0.5 μm or more, more preferably 1 μm or more, so that the line resistance of the first electroconductive layer 71 falls within a desired range.

The first electroconductive layer 71 may be composed of a plurality of layers. The first electroconductive layer may have, for example, a layered structure composed of a lower layer having a low contact resistance with a transparent electrode layer on the surface of a photoelectric conversion section and an upper layer including a material with higher binder resin content. According to this structure, it can be expected that the fill factor of the solar cell is improved as contact resistance with the transparent electrode layer decreases.

Explanations have been provided above principally for the case of forming the first electroconductive layer by a screen printing method, but the method for forming the first electroconductive layer is not limited to the printing method. For example, the pattern formation may performed by an inkjet method or the like.

(Second Electroconductive Layer)

The second electroconductive layer 72 is formed on the first electroconductive layer 71 by a plating method. The metal deposited as the second electroconductive layer is not particularly limited as long as it is a material that can be formed by a plating method, and for example, copper, nickel, tin, aluminum, chromium, silver, gold, zinc, lead, palladium or the like, or a mixture thereof can be used.

Electric current principally passes through the second electroconductive layer during operation (electricity generation) of the solar cell. Thus, the line resistance of the second electroconductive layer is preferably as low as possible so as to suppress the electric loss caused by resistance in the second electroconductive layer. Specifically, the line resistance of the second electroconductive layer is preferably 1 Ω/cm or less, more preferably 0.5 Ω/cm or less. On the other hand, it suffices that the line resistance of the first electroconductive layer is so low that the layer can function as an underlying layer at the time of electroplating, with an example thereof being 5 Ω/cm or less.

The second electroconductive layer can be formed by either of an electroless plating method and an electroplating method. The electroplating method is suitably used in order to increase productivity. In the electroplating method, the rate of deposition of a metal can be increased, so that the second electroconductive layer can be formed in a short time.

Figure 3:
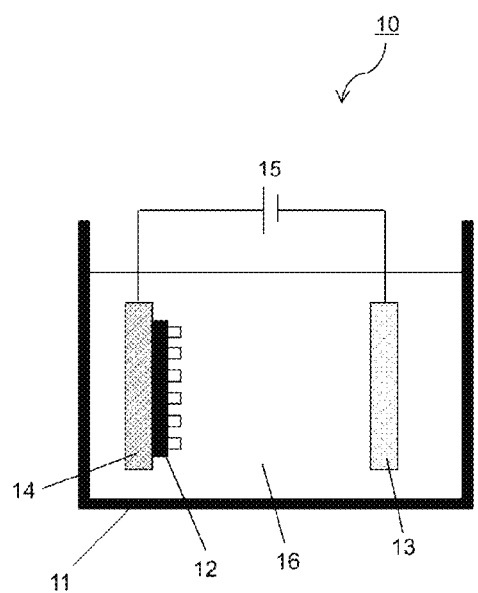
FIG. 3 is a structural schematic view of a plating apparatus.

A method for forming a second electroconductive layer by the electroplating method will be described, taking acidic copper plating as an example. FIG. 3 is a conceptual view of a plating apparatus 10 that is used for forming the second electroconductive layer. A substrate 12 having a first electroconductive layer on a photoelectric conversion section and an anode 13 are immersed in a plating solution 16 in a plating tank 11. The first electroconductive layer 71 on the substrate 12 is connected to a power source 15 through a substrate holder 14. By applying a voltage between the anode 13 and the substrate 12, copper can be selectively deposited on the first electroconductive layer.

The plating solution 16 used for acidic copper plating contains copper ions. For example, a solution of known composition, which has copper sulfate, sulfuric acid and water as main components, can be used, and by causing a current of 0.1 to 10 A/dm$^2$ to pass therethrough, a metallic layer as the second electroconductive layer can be deposited. The suitable plating time is appropriately set according to the area of a collecting electrode, the current density, cathode current efficiency, desired thickness and so on.

The second electroconductive layer may be composed of a plurality of layers. For example, by forming a first plating layer, made of a material having a high electroconductivity, such as Cu, on the first electroconductive layer via an opening section of an insulating layer, and then forming on the surface of the first plating layer a second plating layer excellent in chemical stability, a collecting electrode having low resistance and being excellent in chemical stability can be formed.

[Insulating Layer]

In the present invention, the second electroconductive layer is formed on the first electroconductive layer by a plating method, as mentioned above.

When a region on the photoelectric conversion section where the first electroconductive layer is not formed (first electroconductive layer-non-formed region) is exposed during formation of the second electroconductive layer, the photoelectric conversion section comes into contact with a plating solution, so that metal ions in the plating solution penetrate to the inside of the photoelectric conversion section (silicon substrate etc.), leading to deterioration of solar cell characteristics. When like a heterojunction solar cell, the transparent electrode layer is formed on the outermost surface of the photoelectric conversion section, the transparent electrode layer as well as the first electroconductive layer is energized in electroplating, and therefore a metal is deposited on the first electroconductive layer-non-formed region as well.

In the present invention, an insulating layer 90 is formed on the first electroconductive layer-non-formed region of the photoelectric conversion section for protecting the photoelectric conversion section, and after formation of the insulating layer, the second electroconductive layer is formed by plating. The insulating layer 90 includes a first insulating layer 91 that is in contact with a first electroconductive layer 71; and a second insulating layer 92 formed so as to cover at least a part of the first insulating layer 91.

First Embodiment

Figure 4:
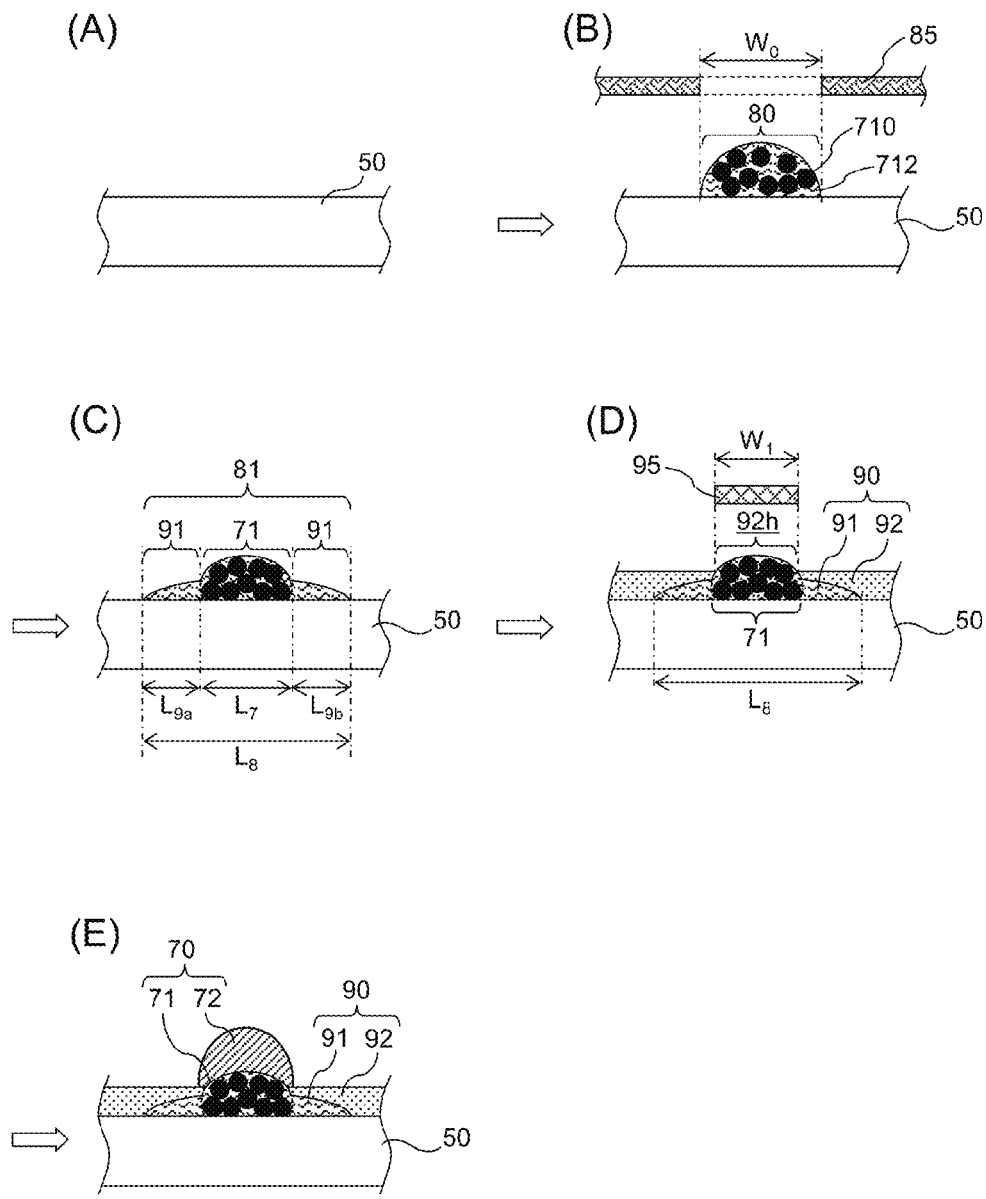
FIG. 4 is a conceptual view showing a production process for a solar cell according to a first embodiment of the present invention.

Hereinafter, a mode of forming a second insulating layer patterned into a predetermined shape using a mask or the like after formation of a first insulating layer will be described as a first embodiment. FIG. 4 is a conceptual flow chart showing a method for forming an insulating layer 90 and a collecting electrode 70 on a photoelectric conversion section 50 of a solar cell according to the first embodiment of the present invention.

In this embodiment: first the photoelectric conversion section 50 is provided (photoelectric conversion section providing step, FIG. 4 at (A)), For example, in the case of a heterojunction solar cell, a photoelectric conversion section including a silicon-based thin-film and a transparent electrode layer on a silicon substrate is provided, as described above.

For forming a first electroconductive layer, an electroconductive paste containing electroconductive fine particles 710 and an insulating material 712 is applied onto a first principal surface of the photoelectric conversion section 50. The electroconductive paste is applied (printed) using, for example, a screen plate having art opening pattern corresponding to a shape of the collecting electrode. When the electroconductive paste is printed using a screen plate 85 having an opening width $W_O$, an electroconductive paste coating region 80 having a width substantially equal to $W_O$ is formed on the photoelectric conversion section (FIG. 4 at (B)). Herein, the ratio between the insulating material and the electroconductive fine particle in the electroconductive paste is set so as to be equal to or more than the so-called percolation threshold (a critical value of a ratio corresponding, to the low-melting-point material content at which electroconductivity is exhibited).

From the paste coating region where the paste is applied onto the photoelectric conversion section, the paste is wet-spread over a surface of the photoelectric conversion section to form a coating layer 81 having a width larger than the opening width $W_O$ of the screen plate (FIG. 4 at (C)). At this time, the insulating material in the paste is exuded from the coating region and wet-spread over the photoelectric conversion section to come into contact with the outer edge of a first electroconductive layer 71 containing the electroconductive fine particles 710 and the insulating material 712, so that a first insulating layer 91 is formed. In this case, the first insulating layer 91 is formed of a material identical to the insulating material in the first electroconductive layer 71.

For example, by appropriately adjusting the contents of electroconductive fine particles and a binder resin which are contained in the electroconductive paste for the first electroconductive layer formation, the binder resin exudes from the coating region, so that a first insulating layer that is in contact with the outer edge of the first electroconductive layer is formed. A width $L_9$ between a boundary 7B at which the first electroconductive layer 71 and the first insulating layer 91 are in contact with each other and an end 9B of the first insulating layer, i.e., a line width of the first insulating layer is preferably 0.2 mm to 1.0 mm, more preferably 0.5 mm to 1.0 mm. When the line width of the first insulating layer falls within the above-mentioned range, registration in formation of a second insulating layer becomes easy. Further, an area in the vicinity of a boundary between a first electroconductive layer-formed region and a first electroconductive layer-non-formed region can be protected against a plating solution during formation of a second electroconductive layer on the first electroconductive layer by plating.

Figure 5:
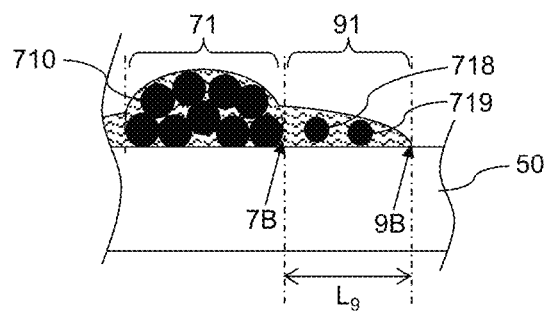
FIG. 5 is a schematic view showing a boundary between an electroconductive layer and an insulating layer

When the insulating material (binder resin) exudes from the first electroconductive layer forming electroconductive paste to form the first insulating layer 91, a region having electric conductivity with a plurality of electroconductive fine particles 710 being in contact with one another in a direction parallel to a surface of the photoelectric conversion section 50 is the first electroconductive layer 71, and a region that is in contact with the outer edge of the first electroconductive layer 71 is the first insulating layer 91, as shown in FIG. 5. When some of electroconductive fine particles in the electroconductive paste exudes along with the insulating material, but are isolated from the electroconductive fine particles 710 of the first electroconductive layer 71 and do not exhibit electric conductivity like electroconductive fine particles 718 and 719 in FIG. 5, a region containing these isolated electroconductive fine particles is considered as the first insulating layer. The phrase "electroconductive fine particles do not exhibit electric conductivity" means typically a state in which electroconductive fine particles in an exuded portion are covered with an insulating material and isolated from other electroconductive fine particles. For suppressing shading by electroconductive fine particles, it is preferred that the number of electroconductive fine particles contained in the first insulating layer 91 is small, and it is more preferred that the first insulating layer does not contain electroconductive fine particles.

By appropriately adjusting a particle size of the electroconductive fine particle contained in the electroconductive paste, a content ratio of electroconductive fine particles to the insulating material, a viscosity of the electroconductive paste, and so on, the line width of the first insulating layer 91 can be made to fall within a desired range. For suppressing exudation of electroconductive fine particles to the first insulating layer, the particle size of the electroconductive fine particle is preferably 0.25 μm or more, more preferably 0.5 μm or more. The particle size of the electroconductive fine particle is more preferably 2 to 3 μm. The viscosity of the electroconductive paste at 25° C. is preferably 50 to 400 Pa·s, more preferably 100 to 350 Pa·s, further preferably 200 to 300 Pa·s. Preferably, the content of the insulating resin material in the electroconductive paste is adjusted so that the viscosity of the paste falls within the above-mentioned range. Although the optimum value of the content varies depending on a type of the resin and so on, the content of the insulating resin material is preferably 5 wt % to 20 wt %, for example.

When the electroconductive paste contains a solvent, drying is performed as necessary. When a photocurable or thermosetting resin material is contained as the resin material in the electroconductive paste, the electroconductive paste may be cured by photoirradiation or heating.

After the first electroconductive layer 71 and the first insulating layer 91 are formed by applying the electroconductive paste onto the first principal surface of the photoelectric conversion section, the second insulating layer 92 is formed on the first electroconductive layer-non-formed region (second insulating layer forming step). The second insulating, layer 92 is formed so as to cover at least a part of the first insulating layer 91 (FIG. 4 at (D)). Preferably, the second insulating layer 92 is formed so as to cover the whole surface of the first insulating layer 91. The second insulating, layer 92 may also be formed on the first electroconductive layer 71. It is to be noted that at least a part of the first electroconductive layer-formed region has no second insulating layer formed thereon. In other words, the second insulating layer 92 has an opening section 92h on the first electroconductive layer-formed region.

In the first embodiment of the present invention, deposition is performed such that at least a part of the first electroconductive layer-formed region has no second insulating layer formed thereon. Examples of the method for depositing the second insulating layer include dry methods such as CVD, sputtering and vapor deposition, and wet methods such as screen printing, ink jetting and spray coating. For example, in the dry method, deposition is performed while the first electroconductive layer 71 is covered with a mask 95 so as not to form the second insulating layer on the first electroconductive layer. In the wet method, the opening section 92h can be formed on the first electroconductive layer-formed region by performing deposition while covering the first electroconductive layer 71 with the mask 95. When the second insulating layer is formed by screen printing, the insulating material is applied (printed) using a screen plate having an opening pattern corresponding to an opposite pattern (negative pattern) to a shape of the first electroconductive layer-formed region (i.e., a shape of the collecting electrode).

On the first principal surface of the photoelectric conversion section, the second insulating layer 92 is formed so as to cover at least a part of the first insulating layer 91. Preferably, the second insulating layer 92 is formed on the whole surface of a region where the coating layer 81 is not formed, so that the whole surface of the first electroconductive layer-non-formed region on the first principal surface is covered with the insulating layer 90. In other words, the first electroconductive layer-non-formed region on the first principal surface is preferably covered with at least one of the first insulating layer 91 and the second insulating layer 92.

After the formation of the second insulating layer 92, a second electroconductive layer 72 is formed by a plating method (a plating step; FIG. 4 at (E)). In this embodiment, the first electroconductive layer 71 is exposed at an opening section 9n where the second insulating layer 92 is not formed. Therefore, in the plating step, the first electroconductive layer is exposed to plating solution so that metal can be deposited at the opening section 92h as an origination point.

When the insulating layer 90 is formed on the entire first electroconductive layer-non-formed region, the insulating layer 90 functions as a protecting layer and the photoelectric conversion section 50 can be chemically and electrically protected from a plating solution when the second electroconductive layer is formed by a plating method. For example, when a transparent electrode layer 6a is formed on the surface of the photoelectric conversion section 50 as in a heterojunction solar cell, by formation of the insulating layer 90 on the surface of the transparent electrode layer, contact of the transparent electrode layer with a plating solution is suppressed, so that deposition of a metallic layer (second electroconductive layer) onto the transparent electrode layer can be prevented.

The collecting electrode on the light-receiving side of the solar cell is required to have a small line width (small shading area) and low resistance, and therefore the ratio of a thickness to a width (aspect ratio) is preferably large. As described in Patent Document 3 (JP-A-2010-98232), when the electroconductive paste flows to be wet-spread, the line width of the collecting electrode increases, so that the aspect ratio decreases, leading to an increase in shading area. Therefore, when a collecting electrode and an electroconductive seed are formed using an electroconductive paste, an electroconductive paste having a high viscosity, so that exudation due to wet-spreading hardly occurs, is generally used. On the other hand, as a result of studies by the inventors, it has been found that when an electroconductive layer is formed using the above-mentioned electroconductive paste, a transparent electrode layer or the like immediately below the electroconductive layer is dissolved in a plating solution during plating, so that the electroconductive layer is easily peeled from a photoelectric conversion section, if pinholes, etc. occur in an insulating layer in the vicinity of the electroconductive layer.

In the present invention, on the other hand, the electroconductive paste is wet-spread on the photoelectric conversion section and the insulating material exudes, so that the first electroconductive layer 71 and the first insulating layer 91 that is in contact with the outer edge thereof are formed as the continuous integrated coating layer 81. Therefore, a gap is not formed between the first electroconductive layer and the insulating layer, and even when the second insulating layer formed on the first insulating layer has pinholes, or an area where the thickness is locally reduced, contact between the photoelectric conversion section in the vicinity of the first electroconductive layer and the plating solution is suppressed, so that the first electroconductive layer is hardly peeled from the photoelectric conversion section.

In the present invention, the second insulating layer 92 is formed on the first insulating layer 91 that is in contact with the outer edge of the first electroconductive layer 71, and therefore in the vicinity of the first electroconductive layer 71, the insulating layer 90 has a two-layer structure. Each of the first electroconductive layer-formed region and a surface of the photoelectric conversion section in the vicinity thereof (transparent electrode layer for the heterojunction solar cell) is a contact region between the photoelectric conversion section and the collecting electrode. Since the insulating layer 90 on the contact region has a two-layer structure, contact between the plating solution and the contact region of the photoelectric conversion section is considerably reduced in the plating step. Contact between the contact region of the photoelectric conversion section and environmental factors (such as moisture and organic gases) is suppressed during actual use of the solar cell. Therefore, the configuration of the present invention is advantageous in improvement of reliability of the solar cell in addition to enhancement of solar cell characteristics.

Generally, for selectively depositing a metallic layer on an electroconductive seed by a plating method, it is necessary to dispose a mask in conformity with a shape of an electroconductive seed (width of electroconductive seed), and strict registration accuracy is required. For example, in a conventional technique, if registration accuracy between the opening section of the screen plate 85 in screen printing of the electroconductive seed and a shield region with the mask 95 in formation of the insulating layer is low, a gap is formed between the electroconductive seed and the insulating layer, and the plating solution penetrates through the gap, leading to deterioration of characteristics.

In the present invention, on the other hand, the first insulating layer 91 is formed in contact with the outer edge of the first electroconductive layer 71, and therefore during formation of the second insulating layer, it is only necessary to arrange a mask so as to cover at least a part of the first electroconductive layer-formed region, so that there is a margin of registration accuracy which corresponds to the width $L_9$ of the first insulating layer 91. Therefore, strict registration for disposition of the mask and the printing position is unnecessary during formation of the second insulating layer, so that productivity can be improved.

As the material of the second insulating layer 92, a material that is electrically insulating is used. It is desirable that the second insulating layer 92 be a material having chemical stability to a plating solution. By using a material having high chemical stability to a plating solution, the second insulating layer 92 protects the photoelectric conversion section from plating solution during plating step of forming the second electroconductive layer, so that damage to the surface of the photoelectric conversion section is reduced.

The second insulating layer 92 preferably has high adhesive strength with the photoelectric conversion section 50. For example, in the heterojunction solar cell, the second insulating layer 92 preferably has high adhesive strength with the light-receiving side transparent electrode layer 6a on the surface of the photoelectric conversion section 50. By increasing adhesive strength between the transparent electrode layer and the insulating layer, the second insulating layer becomes hard to peel off during the plating step, so that deposition of a metal onto the transparent electrode layer can be prevented.

For the second insulating layer 92, a material having low optical absorption is preferably used. The second insulating layer 92 is formed on the light-receiving side of the photoelectric conversion section 50, and therefore if optical absorption by the insulating layer is low, a larger amount of light can be introduced into the photoelectric conversion section. For example, when the second insulating layer 92 has sufficient transparency with a transmittance of 90% or more, the optical loss at the second insulating layer by optical absorption is low, the solar cell can be provided for a practical use without removing the insulating layer after forming the second electroconductive layer. Consequently, the production process of the solar cell can be simplified, so that productivity can be further improved. When a solar cell is provided for a practical use without removing the second insulating layer 92, it is desirable that a material having sufficient weather resistance and stability to heat/humidity in addition to transparency is used for forming the second insulating layer 92.

The material of the second insulating layer may be an inorganic insulating material or an organic insulating material. As the inorganic insulating material, a material such as silicon oxide, silicon nitride, titanium oxide, aluminum oxide, magnesium oxide or zinc oxide can be used. As the organic insulating material, a material such as polyester, an ethylene-vinyl acetate copolymer, acrylic, epoxy or polyurethane can be used. An organic-inorganic hybrid insulating material can also be used.

For formation of an insulating layer made of an inorganic material such as silicon oxide or silicon nitride, a dry process such as a plasma-enhanced CVD method or a sputtering method is suitably used. When the second insulating layer 92 is formed by a dry process as typified by a plasma-enhanced CVD method or the like, the thickness thereof is preferably set within a range of 30 nm to 250 nm, and more preferably set within a range of 50 nm to 250 nm, so that the second insulating layer 92 is allowed to have preferable antireflection characteristics.

For formation of an insulating layer made of an organic material, a wet process such as a screen printing method is suitably used. By these methods, a film of a densified structure having reduced defects such as pinholes can be formed.

The thickness of the second insulating layer 92 is appropriately set according to a material of the second insulating layer and a method for formation of the second insulating layer. When the second insulating layer 92 is formed by a wet method such as a screen printing method, the second insulating layer is preferably thick to the extent that surface irregularities of the transparent electroconductive layer are fully covered during printing of the insulating layer. From such a point of view, the thickness of the second insulating layer is preferably 10 μm or more, more preferably 15 μm or more. The collecting electrode-formed region as an origination point in the plating step should not be covered with the second insulating layer. From such a point of view, the thickness of the second insulating layer is preferably 40 μm or less, more preferably 30 μm or less.

Second Embodiment

As described above, in the first embodiment, the second insulating layer 92 having the opening section 92h is formed on the first electroconductive layer-formed region by a method for covering the first electroconductive layer using a mask, a printing method, or the like. On the other hand, in a second embodiment of the present invention, a second insulating layer 92 is formed on the whole surface of a first electroconductive layer 71, an opening is then formed in the second insulating layer 92 on the first electroconductive layer 71, and a second electroconductive layer 72 is formed by a plating method with the opening as an origination point.

In the second embodiment, the method for forming an opening in the second insulating layer is not particularly limited, and polishing using a file, mechanical drilling, a method in which an insulating layer is locally peeled using a pressure sensitive adhesive tape, laser irradiation, chemical etching, or the like may be employed.

Preferably, a low-melting-point material in the first electroconductive layer is thermally fluidized to form an opening in the second insulating layer on the first electroconductive layer. For example, when the second insulating layer is formed on the first electroconductive layer containing a low-melting-point material, and then heating (annealing) is performed at a temperature of not lower than a thermal-fluidization onset temperature $T_1$ of the low-melting-point material to change a surface shape of the first electroconductive layer, an opening (crack) is formed in the second insulating layer formed on the first electroconductive layer.

Figure 6:
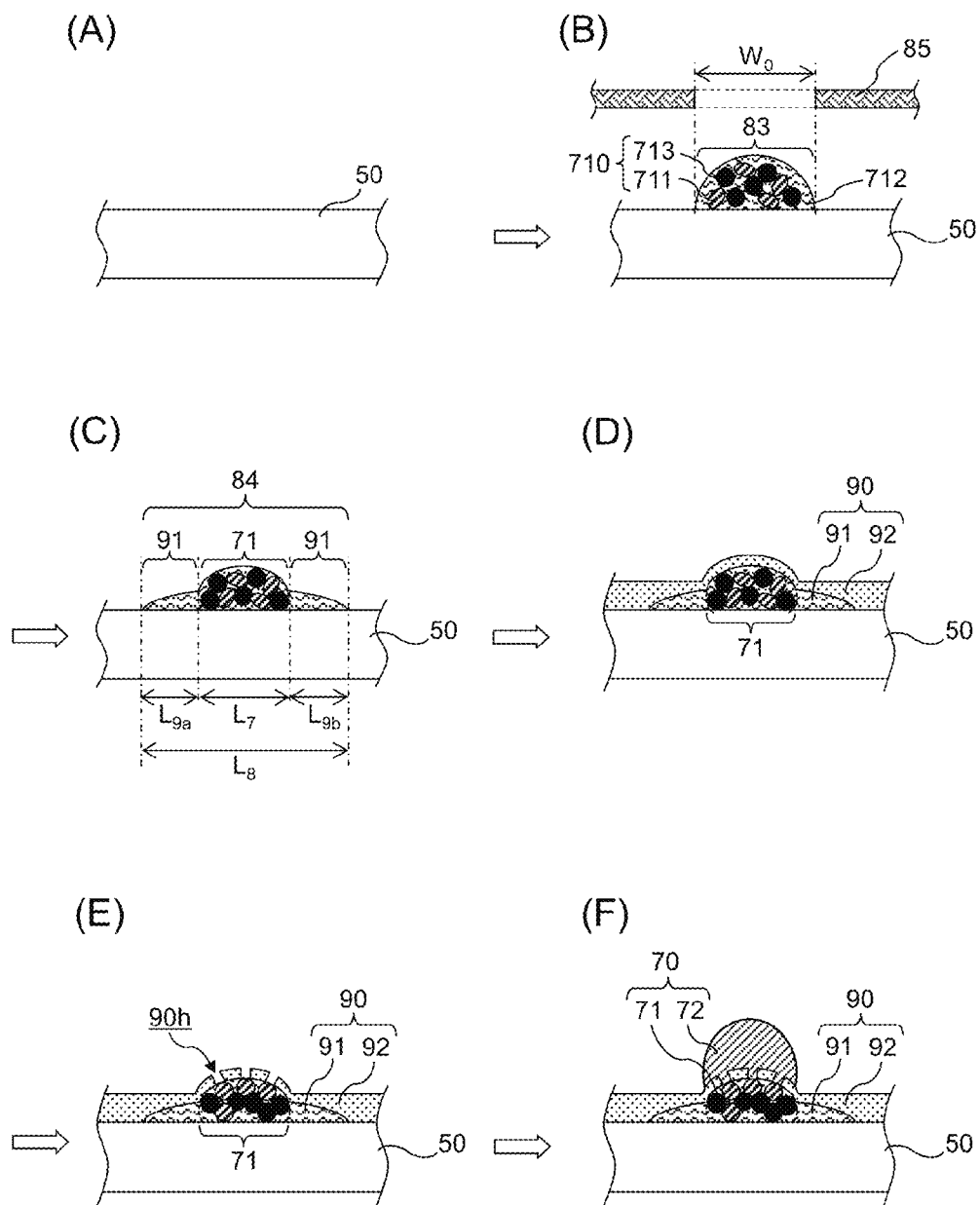
FIG. 6 is a conceptual view showing a production process of a solar cell according to a second embodiment of the present invention.

A method will be described below with reference to the drawings, in which an opening is formed in the insulating layer using thermal-fluidization of a low-melting-point material in the first electroconductive layer and the second electroconductive layer is formed with the opening as an origination point. FIG. 6 is a schematic procedural view showing a method for forming an insulating layer 90 and a collecting electrode 70 on a photoelectric conversion section 50 of a solar cell, according to the second embodiment of the present invention.

First, similarly to the first embodiment, a photoelectric conversion section 50 is provided (photoelectric conversion section providing step, FIG. 6 at (A)), For forming a first electroconductive layer, an electroconductive paste containing a low-melting-point material 711 and an insulating material 712 is then applied onto a first principal surface of the photoelectric conversion section 50 (FIG. 6 at (B)).

The low-melting-point material 711 is preferably electroconductive fine particles. When the low-melting-point material 711 has an electroconductivity, the electroconductive paste contains the low-melting-point material 711 and the insulating material (resin material) 712. When the low-melting-point material is insulating, the electroconductive paste contains an electroconductive material in addition to the low-melting-point material and the resin material. As described later, the electroconductive paste may contain a different material such as a high-melting-point material 713 in addition to the low-melting-point material 711. In this embodiment, similarly to the first embodiment, the insulating material in the paste exudes from an electroconductive paste coating region 83 and wet-spread over the photoelectric conversion section to come into contact with the outer edge of the first electroconductive layer 71, so that the first insulating layer 91 is formed (FIG. 6 at (C)).

After the first electroconductive layer 71 and the first insulating layer 91 are formed by applying the electroconductive paste onto the first principal surface of the photoelectric conversion section, the second insulating layer 92 is formed on the first electroconductive layer-non-formed region (second insulating layer forming step). The second insulating layer 92 is formed so as to cover substantially the whole of the coating layer 84, i.e. substantially the whole of the first electroconductive layer 71 and the first insulating layer 91 (FIG. 6 at (D)). Here, the phrase "covering substantially whole" includes a state in which local pinholes exist and a state in which the insulating layer is locally formed like islands, in addition to a state in which the whole of the first electroconductive layer and the first insulating layer is covered. In this embodiment, it is preferred that the second insulating layer 92 is formed on the whole surface of a region where the coating layer 84 is not formed, and the whole surface of the first electroconductive layer-non-formed region on the first principal surface is covered with the insulating layer 90.

After the second insulating layer is formed, annealing treatment is carried out by heating (an annealing step; FIG. 6 at (E)). In the annealing treatment, the first electroconductive layer 71 is heated to an annealing temperature Ta, so that the low-melting-point material 711 is thermally fluidized to thereby change the surface shape of the first electroconductive layer 71. Accordingly, the second insulating layer 92 formed on the first electroconductive layer 71 is deformed to generate an opening 90$k$ The opening is formed in the form of, for example, cracks.

After the opening 90$h$ is formed in the second insulating layer 92, a second electroconductive layer 72 is formed by a plating method (a plating step; FIG. 6 at (F)). The first electroconductive layer 71 is covered with the second insulating layer 92, but at the opening 90$h$ of the second insulating layer 92, the first electroconductive layer 71 is exposed. Therefore, in the plating step, the first electroconductive layer is exposed to plating solution and metal can be deposited at the opening 90$h$ as an origination point.

In this embodiment, similarly to the previous embodiment, the insulating layer 90 has a two-layer structure in the vicinity of the first electroconductive layer 71, and therefore contact between the photoelectric conversion section and a plating solution can be prevented in the plating step. In this embodiment, the second insulating layer may be formed on the whole surface, and therefore registration of a mask and a screen plate in the vicinity of a collecting electrode-formed region is unnecessary during formation of the second insulating layer, so that productivity can be improved.

In this embodiment, the first electroconductive layer 71 contains a low-melting-point material 711 having a thermal-fluidization onset temperature $T_1$. The thermal-fluidization onset temperature is a temperature at which a material is fluidized by heating to change the surface shape of a layer containing a low-melting-point material, and is typically a melting point. As for polymer materials and glass, a material may be softened to be thermally fluidized at a temperature lower than the melting point. In these materials, the thermal-fluidization onset temperature can be defined as being equal to a softening point. The softening point is a temperature at which the viscosity is $4.5 \times 10^6$ Pa·s (same as the definition for the softening point of glass).

The low-melting-point material is preferably thermally fluidized in the annealing treatment, thus causing a change in surface shape of the first electroconductive layer 71. Therefore, the thermal-fluidization onset temperature $T_1$ of the low-melting-point material is preferably lower than a heating temperature (annealing temperature) Ta in an annealing step.

The lower limit of the thermal-fluidization onset temperature $T_1$ of the low-melting-point material is not particularly limited. The low-melting-point material is preferably not thermally fluidized during formation of the first electroconductive layer, so that an amount of surface shape change of the first electroconductive layer in the annealing treatment is increased to form the opening 90$h$ in the second insulating layer 92 easily. When an electroconductive paste is used for formation of the first electroconductive layer 71 (and the first insulating layer 91), heating may be carried out for drying the paste. In this case, the thermal-fluidization onset temperature $T_1$ of the low-melting-point material is preferably higher than the temperature of heating for drying the electroconductive paste. Accordingly, the thermal-fluidization onset temperature $T_1$ of the low-melting-point material is preferably 80° C. or higher, more preferably 100° C. or higher.

The low-melting-point material may be an organic substance or an inorganic substance as long as the thermal-fluidization onset temperature $T_1$ falls within the aforementioned range. The low-melting-point material may be electroconductive or insulating, but is desired to be a metallic material that has electroconductivity. If the low-melting-point material is a metallic material, the resistance value of the first electroconductive layer can be decreased, so that uniformity of the thickness of the second electroconductive layer can be improved when the second electroconductive layer is formed by electroplating method. If the low-melting-point material is a metallic material, the contact resistance between the photoelectric conversion section 50 and the collecting electrode 70 can also be reduced.

As the electroconductive low-melting-point material, a low-melting-point metallic material alone or an alloy thereof, or a mixture of a plurality of low-melting metallic materials can be suitably used. Examples of the low-melting-point metallic material include indium, bismuth and gallium. When the low-melting-point material is a particle shape material such as metal particle, the particle size $D_L$ of the low-melting-point material is preferably no less than 1/20, more preferably no less than 1/10, of the thickness of the first electroconductive layer 71, so that a formation of an opening in the second insulating layer by the annealing treatment is facilitated.

The shape of particles of the low-melting-point material is not particularly limited, but is preferably a non-spherical shape such as a flat shape. Non-spherical particles formed by binding spherical particles together by a method such as sintering are also suitably used. In general, when metal particles are brought into a liquid phase state, the surface shape tends to be spherical for reducing surface energy. If the low-melting-point material of the first electroconductive layer before annealing treatment is non-spherical, the amount of change in surface shape of the first electroconductive layer is larger because particles become more spherical when heated to the thermal-fluidization onset temperature $T_1$ or higher in the annealing treatment. Therefore, it becomes easy to form an opening section in the second insulating layer 92 on the first electroconductive layer 71.

The first electroconductive layer 71 preferably contains, in addition to the aforementioned low-melting-point material, high-melting-point material having thermal-fluidization onset temperature that is relatively higher than the thermal-fluidization onset temperature of the low-melting-point material. When the first electroconductive layer 71 includes a high-melting-point material 713, a conductive connection can be efficiently established between the first electroconductive layer and the second electroconductive layer, so that conversion efficiency of the solar cell can be improved. For example, when a material with high surface energy is used as the low-melting-point material, the first electroconductive layer 71 is exposed to a high temperature in the annealing treatment, the low-melting-point material is thereby brought into liquid phase state and as a result, particles of the low-melting-point material aggregate into coarse particles, so that disconnecting occurs in the first electroconductive layer 71 in some cases. In contrast, the high-melting-point material is not brought into a liquid phase state by heating in the annealing treatment, and therefore by including the high-melting-point material in the first electroconductive layer forming material, disconnecting of the first electroconductive layer by coarsening of the low-melting-point material can be suppressed.

The thermal-fluidization onset temperature $T_2$ of the high-melting-point material is preferably higher than the annealing temperature Ta. That is, when the first electroconductive layer 71 contains the low-melting-point material and the high-melting-point material, the thermal-fluidization onset temperature $T_1$ of the low-melting-point material, the thermal-fluidization onset temperature $T_2$ of the high-melting-point material and the annealing temperature Ta in the annealing treatment preferably satisfy $T_1<Ta<T_2$. The high-melting-point material may be an insulating material or an electroconductive material, but is preferably an electroconductive material in order to reduce the resistance of the first electroconductive layer. When the electroconductivity of the low-melting-point material is low, the overall resistance of the first electroconductive layer can be reduced by using a material having high electroconductivity as the high-melting-point material. As the electroconductive high-melting-point material, for example, a metallic material alone such as silver, aluminum or copper, or a plurality of metallic materials can be suitably used.

When the first electroconductive layer 71 contains the low-melting-point material and the high-melting-point material, the content ratio thereof is appropriately adjusted from the viewpoints of suppression of disconnecting by coarsening of the low-melting-point material as described above, the electroconductivity of the first electroconductive layer, ease of forming an opening in the insulating layer (increase of the number of origination points for metal deposition on the second electroconductive layer), and so on. The optimum value of the content ratio varies depending on combinations of materials and particle sizes used, but for example, the weight ratio between the low-melting-point material and the high-melting-point material (low-melting-point material:high-melting-point material) is set in a range from 5:95 to 67:33. The weight ratio between the low-melting-point material:the high-melting-point material is more preferably set from 10:90 to 50:50, further preferably set to from 15:85 to 35:65.

As described above, the first electroconductive layer 71 exhibits electroconductivity, and it suffices that its volume resistivity is $10^{-2}$ Ω·cm or less. The volume resistivity of the first electroconductive layer 71 is preferably $10^{-4}$ Ω·cm or less. When the first electroconductive layer has only the low-melting-point material, it suffices that the low-melting-point material has electroconductivity. When the first electroconductive layer contains the low-melting-point material and the high-melting-point material, it suffices that at least either one of the low-melting-point material and the high-melting-point material is electroconductive. Examples of the combination of the low-melting-point material/high-melting-point material include: insulating material/electroconductive material; electroconductive material/insulating material; and electroconductive material/electroconductive material. In order to make the first electroconductive layer less resistive, it is preferable that both the low-melting-point material and high-melting-point material be electroconductive materials.

In the annealing treatment, the opening 90*h* in the second insulating layer 92 is formed principally on the low-melting-point material 711 of the first electroconductive layer 71. When the low-melting-point material is an insulating material, a part immediately below the opening section is insulating, but a plating solution is also penetrated into the electroconductive high-melting-point material present on the periphery of the low-melting-point material, and therefore a conductive connection can be established between the first electroconductive layer and the plating solution.

Besides using the combination of the low-melting-point material and the high-melting-point material described above, conversion efficiency may also be improved by adjusting the size of electroconductive materials (e.g., particle size) and the like in the first electroconductive layer 71 to suppress the disconnecting of the first electroconductive layer due to heating in the annealing treatment. For example, even a material having a high melting point, e.g. silver, copper or gold, in the form of fine particles having a particle size of 1 μm or less, undergoes sintering-necking (fusion of fine particles) at a temperature lower than the melting point, i.e., about 200° C., or a lower temperature $T_1'$, and therefore can be used as the "low-melting-point material" of the present invention. When heated to the sintering-necking onset temperature $T_1'$ or higher, the material that undergoes sintering-necking is deformed at and near the outer periphery of fine particles, so that the surface shape of the first electroconductive layer can be changed to form an opening in the second insulating layer. Even when fine particles are heated to the sintering-necking onset temperature or higher, the fine particles retains a solid phase state at any temperature that is lower than a melting point $T_2'$, and therefore disconnecting by coarsening of the material hardly occurs. In this respect, it can be said that the material that undergoes sintering-necking, such as metal fine particles, has an aspect of the "high-melting-point material" as well while being the "low-melting-point material" in the present invention. In the material that undergoes sintering-necking, the sintering-necking onset temperature $T_1'$ can be defined as being equal to a thermal-fluidization onset temperature $T_1$.

In this embodiment, the thickness of the second insulating layer 92 is preferably small to the extent that an opening can be formed in the second insulating layer by means of, for example, stress at an interface, which occurs due to a change in surface shape of the first electroconductive layer in an annealing treatment. From such a point of view, the thickness of the second insulating layer 92 is preferably 1000 nm or less, more preferably 500 nm or less. The thickness of the second insulating layer on the first electroconductive layer-formed region may be different from the thickness of the second insulating layer on the first electroconductive layer-non-formed region. For example, in the first electroconductive layer-formed region, the thickness of the second insulating layer may be set from the viewpoint of ease of forming an opening by the annealing treatment, and in the first electroconductive layer-non-formed region, the thickness of the second insulating layer may be set so as to obtain an optical thickness providing appropriate antireflection characteristics.

In this embodiment, as well as in the first embodiment, the material of the second insulating layer may be an inorganic insulating material or an organic insulating material. The material of the insulating layer in this embodiment is preferably an inorganic material having a low elongation at break, so that a formation of an opening in the insulating layer, which occurs as the surface shape of the first electroconductive layer changes by stress or the like at the interface, in the annealing treatment is facilitated.

In this embodiment, the second insulating layer 92 on the first electroconductive layer-formed region does not have to be necessarily a seamless layer, but may be an island layer.

The term "island" in this specification means a state in which a region, on which no insulating layer is formed, is provided at a part of the surface.

In this embodiment, the second insulating layer 92 on the first electroconductive layer-formed region can also contribute to improvement of adhesive strength between the first electroconductive layer 71 and the second electroconductive layer 72. For example, when a Cu layer is formed on an Ag layer as an under-layer electrode by a plating method, adhesive strength between the Ag layer and the Cu layer is low, but it can be expected that the adhesive strength of the second electroconductive layer is increased to improve the reliability of the solar cell as a result of formation of the Cu layer on second insulating layer composed of silicon oxide or the like.

The annealing temperature (heating temperature) Ta in the annealing treatment is preferably higher than the thermal-fluidization onset temperature $T_1$ of the low-melting-point material, i.e. $T_1<Ta$. The annealing temperature Ta more preferably satisfies $T_1+1°$ C.$\leq Ta\leq T_1+100°$ C., and further preferably satisfies $T_1+5°$ C.$\leq Ta\leq T_1+60°$ C. The annealing temperature can be appropriately set according to the composition and content of the material of the first electroconductive layer, and so on.

The annealing temperature Ta is preferably lower than the heat-resistant temperature of the photoelectric conversion section 50. In association therewith, the thermal-fluidization onset temperature $T_1$ of the low-melting-point material of the first electroconductive layer 71 is preferably lower than the heat-resistant temperature of the photoelectric conversion section.

The heat-resistant temperature of the photoelectric conversion section is a temperature at which characteristics of a solar cell including the photoelectric conversion section or a solar cell module prepared using a solar cell are irreversibly reduced. The heat-resistant temperature varies depending on the configuration of the photoelectric conversion section. For example, in the heterojunction solar cell, the single-crystalline silicon substrate that forms the photoelectric conversion section hardly undergoes a change in characteristics even when heated to a high temperature of 500° C. or higher, but the transparent electrode layers and amorphous silicon-based thin-films may undergo thermal degradation or diffusion of dope impurities when heated to about 250° C., thus causing an irreversible reduction in the solar cell characteristics.

In other words, a solar cell including a transparent electrode layer and/or an amorphous silicon-based thin-film, such as a heterojunction solar cell or a silicon-based thin-film solar cell, has a heat-resistant temperature of about 250° C. Thus, in the case of the heterojunction solar cell or the silicon-based thin-film solar cell, in which the photoelectric conversion section includes an amorphous silicon-based thin-film, the annealing temperature is preferably set at 250° C. or lower so that thermal damage at the amorphous silicon-based thin-film and the interface thereof are suppressed. For achieving a solar cell having higher performance, the annealing temperature is more preferably 200° C. or lower, further preferably 180° C. or lower.

On the other hand, a crystalline silicon solar cell having a diffusion layer of an opposite conductivity type on first principal surface of a crystalline silicon substrate of a first conductivity type has neither an amorphous silicon thin-film nor a transparent electrode layer, and therefore shows a heat-resistant temperature of about 800° C. to 900° C. Thus, the annealing treatment may be carried out at an annealing temperature Ta higher than 250° C.

In the second embodiment, the method for forming an opening in the second insulating layer is not limited to a method in which an annealing treatment is performed after formation of an insulating layer. For example, when the second insulating layer is formed while the substrate is heated, an opening is formed almost simultaneously with formation of the insulating layer. Here, the term "almost simultaneously with formation of the insulating layer" means a state in which a step other than the insulating layer forming step, such as an annealing treatment, is not performed. In other words, "almost simultaneously with formation of the insulating layer" means a state during or immediately after formation of the insulating layer. The term "immediately after formation" also includes a duration until the substrate is cooled to room temperature etc. after formation of the insulating layer is completed (after heating is stopped). Formation of an opening in the insulating layer on the low-melting-point material also includes a situation in which even after formation of the insulating layer on the low-melting-point material is completed, the insulating layer on the periphery of the low-melting-point material is deformed as the insulating layer is formed on the periphery thereof, so that an opening is formed.

As a method for forming an opening almost simultaneously with formation of the insulating layer, for example, a method is used in which the second insulating layer 92 is formed on the first electroconductive layer 71 while the substrate is heated to a temperature Tb higher than the thermal-fluidization onset temperature $T_1$ of a low-melting-point material 711 of the first electroconductive layer 71 in the insulating layer forming step. Since the second insulating layer 92 is formed on the first electroconductive layer with the low-melting-point material in a fluidized state, stress is generated at a deposition interface concurrently with deposition, so that, opening like a crack, for example, is formed in the insulating layer.

The substrate temperature Tb during formation of the insulating layer (hereinafter, referred to as an "insulating layer formation temperature") refers to a substrate surface temperature at the start of formation of the insulating layer (also referred to as a "substrate heating temperature"). Generally, the mean value of the substrate surface temperature during the formation of the insulating layer is equal to or higher than the substrate surface temperature at the start of deposition. Therefore, when the insulating layer formation temperature Tb is higher than the thermal-fluidization onset temperature $T_1$ of the low-melting-point material, a deformed portion such as an opening can be formed in the insulating layer.

For example, when the second insulating layer 92 is formed by a dry method such as a CVD method or a sputtering method, an opening can be formed by ensuring that the substrate surface temperature during formation of the insulating layer is higher than the thermal-fluidization onset temperature $T_1$ of the low-melting-point material. When the second insulating layer 92 is formed by a wet method, an opening can be formed by ensuring that the substrate surface temperature at the time of drying a solvent is higher than the thermal-fluidization onset temperature $T_1$ of the low-melting-point material. The "deposition starting time point" when the insulating layer is formed by a wet method refers to a time point at which drying of a solvent is started. A preferred range of the insulating layer formation temperature Tb is similar to the preferred range of the annealing temperature Ta.

For example, the substrate surface temperature can be measured with a temperature indication material (so called thermo label or thermo seal) or a thermocouple attached to the substrate surface on the deposition surface side. The temperature of heating part (e.g. a heater) can be appropriately adjusted so that the surface temperature of the substrate falls within a predetermined range.

When an opening is formed almost simultaneously with formation of the insulating layer and there are locations where formation of the opening is insufficient, etc., the above-described annealing step may be further performed after the formation of the insulating layer.

[Optional Additional Steps after Collecting Electrode Formation]

As mentioned above, in both of the first embodiment and the second embodiment of the present invention, the second electroconductive layer is formed by a plating with the opening (section) of the insulating layer on the first electroconductive layer as an origination point. It is preferable that a plating solution remaining on the surface of the substrate 12 is removed after carrying out the plating. By removing the plating solution, a metal deposited on the first electroconductive layer-non-formed region can be removed. Examples of the metal deposited on the first electroconductive layer-non-formed region include those deposited at a pinhole in the second insulating layer 92 as an origination point. As a result of removing such a metal by the plating solution removing step, the shading is reduced, and solar cell characteristics can be further improved.

In the present invention, the insulating layer on the photoelectric conversion section may be removed after forming the collecting electrode (plating step). In particular, when a material having large optical absorption is used as the second insulating layer, the insulating layer removing step is preferably carried out for suppressing reduction of solar cell characteristics by the optical absorption of the insulating layer. The method for removing the second insulating layer is appropriately selected according to the characteristics of the insulating layer material. For example, the second insulating layer can be removed by chemical etching or mechanical polishing. An ashing (incineration) method is also applicable depending on the material. At this time, it is preferable that the second insulating layer on the first electroconductive layer-non-formed region is entirely removed, so that an influx of light is further improved. When a material having small optical absorption is used as the second insulating layer, it is not necessary to carry out the insulating layer removing step.

Explanations have been provided principally for the case of providing the collecting electrode 70 on the light-receiving side of the heterojunction solar cell, but a similar collecting electrode may also be formed on the back side. A solar cell using a crystalline silicon substrate, like the heterojunction solar cell, has a high current value, so that generally the electricity generation loss due to contact resistance between the transparent electrode layer and the collecting electrode tends to be remarkable. In contrast, according to the present invention, the collecting electrode having the first electroconductive layer and the second electroconductive layer has low contact resistance with the transparent electrode layer, thus making it possible to reduce the electricity generation loss resulting from contact resistance.

[Example of Application Other than Heterojunction Solar Cell]

The present invention is applicable to various kinds of solar cells such as: crystalline silicon solar cells other than the heterojunction solar cell; solar cells using a semiconductor substrate other than silicon, such as GaAs; silicon-based thin-film solar cells having a transparent electrode layer on a pin junction or a pn junction of an amorphous silicon-based thin-film or a crystalline silicon-based thin-film, compound semiconductor solar cells such as CIS and CIGS; and organic thin-film solar cells, such as dye-sensitized solar cells and organic thin-film (electroconductive polymer).

The crystalline silicon solar cell includes a configuration in which a diffusion layer of an opposite conductivity type (e.g., n-type) is provided on first principal surface of a crystalline silicon substrate of a first conductivity type (e.g., p-type), and the collecting electrode is provided on the diffusion layer. A crystalline silicon solar cell with this configuration generally includes a conductivity-type layer such as a $p^+$ layer on an opposite side of the first conductivity-type layer. When the solar cell such a configuration in which photoelectric conversion section does not include an amorphous silicon layer or a transparent electrode layer, the thermal-fluidization onset temperature $T_1$ of the low-melting-point material and the annealing temperature Ta may be higher than 250° C.

Examples of the silicon-based thin-film solar cell include an amorphous silicon-based thin-film solar cell having an amorphous intrinsic (i-type) silicon thin-film between a p-type thin-film and an n-type thin-film, and a crystalline silicon-based semiconductor solar cell having a crystalline intrinsic silicon thin-film between a p-type thin-film and an n-type thin-film. A tandem-type thin-film solar cell, in which a plurality of pin junctions is stacked, is also suitable. In this silicon-based thin-film solar cell, the thermal-fluidization onset temperature $T_1$ of the low-melting-point material and the annealing temperature Ta are preferably 250° C. or lower, more preferably 200° C. or lower, further preferably 180° C. or lower, in consideration of the heat resistance of the transparent electrode layer and the amorphous silicon-based thin-film.

[Solar Cell Module]

The solar cell of the present invention is preferably modularized when put into practical use. Modularization of the solar cell is performed by an appropriate method. For example, by connecting a bus bar via an interconnector such as a TAB to a collecting electrode, a plurality of solar cells are connected in series or in parallel, and sealed by a sealing material and a glass plate to thereby perform modularization.

EXAMPLES

The present invention will be more specifically described below by showing preparation examples relating to the heterojunction solar cell, but the present invention is not limited to the examples below.

Preparation Example 1

An n-type single-crystalline silicon wafer having a light incident surface direction identical to the (100) surface and having a thickness of 200 μm was provided as a single-crystalline silicon substrate of a first conductivity type. The silicon wafer was immersed in a 2 wt % aqueous HF solution for 3 minutes to remove silicon oxide covering on the surface, and thereafter rinsed twice with ultrapure water. The silicon substrate was immersed in a 5/15 wt % aqueous KOH/isopropyl alcohol solution held at 70° C. for 15 minutes, and the surface of the wafer was etched to form a textured surface. Thereafter, the wafer was rinsed twice with ultrapure water. The surface of the wafer was observed using an atomic force microscope (AFM manufactured by Pacific Nanotechnology, Inc.), and it was confirmed that the surface of the wafer was etched, and a pyramidal texture surface exposed at the (111) plane was formed.

The wafer after etching was introduced into a CVD apparatus, and at the light-receiving side thereof, i-type amorphous silicon was formed with a thickness of 5 nm as an intrinsic silicon-based thin-film 2a. Conditions for forming i-type amorphous silicon included a substrate temperature of 150° C., a pressure of 120 Pa, a $SiH_4/H_2$ flow ratio of 3/10 and a power density supply of 0.011 W/cm². The thickness of the thin-film in this preparation example is a value calculated from a formation rate determined by measuring the thickness of a thin-film formed on a glass substrate under the same conditions using a spectroscopic ellipsometry (trade name: M2000, manufactured by J.A. Woollam Co. Inc.).

On the i-type amorphous silicon layer 2a, p-type amorphous silicon was formed with a thickness of 7 nm as a silicon-based thin-film 3a of an opposite conductivity type. Conditions for forming the p-type amorphous silicon layer 3a included a substrate temperature of 150° C., a pressure of 60 Pa, a $SiH_4/B_2H_6$ flow ratio of 1/3 and a power density supply of 0.01 W/cm². The $B_2H_6$ gas flow rate mentioned above is a flow rate of a diluting gas wherein $B_2H_6$ concentration was diluted to 5000 ppm using $H_2$ gas.

Thereafter, on the back side of the wafer, an i-type amorphous silicon layer was formed with a thickness of 6 nm as an intrinsic silicon-based thin-film 2b. Conditions for forming the i-type amorphous silicon layer 2b were the same as those for the aforementioned i-type amorphous silicon layer 2a. On the i-type amorphous silicon layer 2b, an n-type amorphous silicon layer was formed with a thickness of 4 nm as a silicon-based thin-film 3b of the first conductivity type. Conditions for forming the n-type amorphous silicon layer 3b included a substrate temperature of 150° C., a pressure of 60 Pa, a $SiH_4/PH_3$ flow ratio of 1/2 and a power density supply of 0.01 W/cm². The $PH_3$ gas flow rate mentioned above is a flow rate of a diluting gas wherein $PH_3$ concentration was diluted to 5000 ppm using $H_2$ gas.

Indium tin oxide (ITO, refractive index: 1.9) was formed thereon with a thickness of 100 nm as transparent electrode layers 6a and 6b, respectively. The transparent electrode layer was formed by applying a power density of 0.5 W/cm² in an argon atmosphere at a substrate temperature of room temperature and a pressure of 0.2 Pa using an indium oxide as a target. On the back side transparent electrode layer 6b, silver was formed with a thickness of 500 nm as a back side metal electrode 8 by a sputtering method. On the light-receiving side transparent electrode layer 6a, a collecting electrode 70 having a first electroconductive layer 71 and a second electroconductive layer 72 were formed.

For formation of the first electroconductive layer 71, a printing paste (coating material) containing electroconductive fine particle and further containing 5 wt % of an epoxy-based resin as an insulating material (binder resin) was used, wherein the electroconductive fine particle 710 includes SnBi metal powder (particle size $D_L$=25 to 35 μm; melting point $T_1$=141° C.) as a low-melting-point material and a silver powder (particle size $D_H$=2 to 3 μm; melting point $T_2$=971° C.) as a high-melting-point material at a weight ratio of 20:80. The printing paste was screen-printed using a screen plate of #230 mesh (opening width: l=85 μm) having an opening width (L=80 μm) matching a collecting electrode pattern, and dried at 180° C. This sample was observed with an optical microscope, and resultantly it was found that a part of the binder resin contained in the first electroconductive layer was exuded, and a first insulating layer 91 consisting of the exudation part and having a width of 0.5 mm was formed in contact with the first electroconductive layer 71.

The wafer with the first electroconductive layer 71 and the first insulating layer 91 are formed thereon was introduced into a CVD apparatus, and a silicon oxide layer (refractive index: 1.5) was formed on the light-receiving side with a thickness of 45 nm as a second insulating layer 92 by a plasma-enhanced CVD method. At this time, the second insulating layer was formed on the whole surface of the first electroconductive layer-non-formed region and the whole surface of the first electroconductive layer. That is, the whole surface of the first electroconductive layer and the first insulating layer was covered with the second insulating layer.

Conditions for forming the second insulating layer 92 included a substrate temperature of 135° C., a pressure of 133 Pa, a $SiH_4/CO_2$ flow ratio of 1/20 and a power density supply of 0.05 W/cm² (frequency 13.56 MHz). Thereafter, the wafer after formation of the insulating layer was introduced into a circulating hot air oven, and subjected to an annealing treatment at 180° C. for 20 minutes in an air atmosphere.

The substrate 12 subjected to steps up to and including the annealing step as described above was introduced into a plating tank 11 as shown in FIG. 3. For a plating solution 16, one obtained by adding additives (product numbers: ESY-2B, ESY-H and ESY-1A, manufactured by C. Uyemura & CO., LTD.) to a solution prepared so that the concentrations of copper sulfate pentahydrate, sulfuric acid and sodium chloride were 120 g/l, 150 g/l and 70 mg/l, respectively, was used. Using the plating solution, plating was carried out under conditions including a temperature of 40° C. and a current of 3 A/dm², so that on the insulating layer on the first electroconductive layer 71, copper was uniformly deposited at a thickness of about 10 μm as a second electroconductive layer 72. Little copper was deposited onto a region where no first electroconductive layer was formed.

Figure 7A:
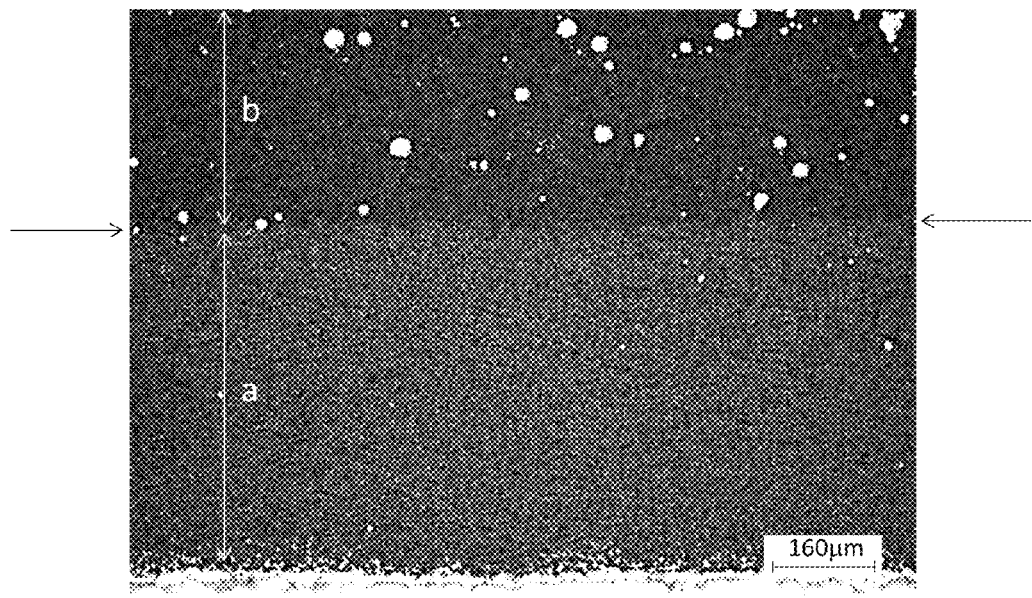
FIG. 7A is an optical micrograph showing a vicinity of an electroconductive layer in a solar cell of a Preparation Example.

Thereafter, with the use of the substrate, plating was further performed excessively at a current density of 5 A/dm² to deposit Cu on the first electroconductive layer-non-formed region in the form of pinholes. A plane observation photograph of the vicinity of the collecting electrode after excessive plating is shown in FIG. 7A. In FIG. 7A, the white part at the lower end of the photograph is a collecting electrode part where copper is deposited as the second electroconductive layer on the first electroconductive layer-formed region. The "region a" below the black arrow in the figure is a region where the second insulating layer (silicon oxide layer) is formed on the first insulating layer (a part where the binder resin in the printing paste exudes), and the "region b" above the black arrow is a region where the second insulating layer is formed directly on the transparent electrode layer. As is evident from FIG. 7A, copper was deposited on the first insulating layer-non-formed region b, whereas copper was rarely deposited on the first insulating layer-formed region a in the vicinity of the first electroconductive layer.

Preparation Example 2

Similarly to Preparation Example 1, a printing paste (coating material) was screen-printed on a light-receiving side transparent electrode layer 6a to form a first insulating layer 91 in contact with a first electroconductive layer 71. A siloxane-based acryl resin was screen-printed using a screen plate having an opening section in a negative pattern to the first electroconductive layer forming pattern, and UV-cured at 400 mJ to form a second insulating layer 92. The second insulating layer was formed on the whole surface of a region where a coating layer 84 of the printing paste was not formed. The second insulating layer was formed so as to cover substantially entire surface of the first insulating layer formed by exudation of a binder resin in the paste, and the second insulating layer was not formed on the first electroconductive layer.

Figure 8A:
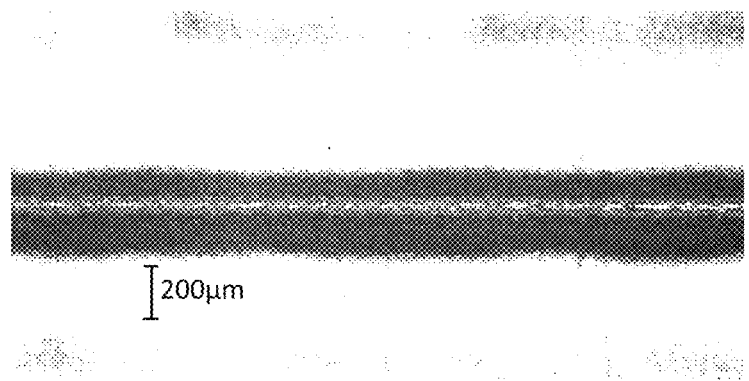
FIG. 8A is an optical micrograph showing a vicinity of an electroconductive layer in a solar cell of a Preparation Example.

Thereafter, copper was deposited as a second electroconductive layer 72 on the first electroconductive layer 71 in the same manner as in Preparation Example 1. Little copper was deposited onto a region where the first electroconductive layer was not formed. In FIG. 8A, the white part at the center is a region where copper is deposited on the first electroconductive layer, and the black part around the white part is a region where the second insulating layer has a small thickness.

Preparation Example 3

A heterojunction solar cell was prepared in the same manner as in Preparation Example 1 except that a paste having a binder resin content of 20 wt % was used as a printing paste for formation of the first electroconductive layer (and first insulating layer).

Preparation Example 4

In Preparation Example 4, a heterojunction solar cell was prepared in the same manner as in Preparation Example 1 except that a paste having a binder resin content of 4 wt % was used as a printing paste for formation of the first electroconductive layer (and first insulating layer). The printing paste was screen-printed, and dried. The sample thus obtained was observed with an optical microscope, and resultantly it was found that the binder resin did not exude from the first electroconductive layer. That is, in Preparation Example 4, the first insulating layer 91 was not formed.

Figure 7B:
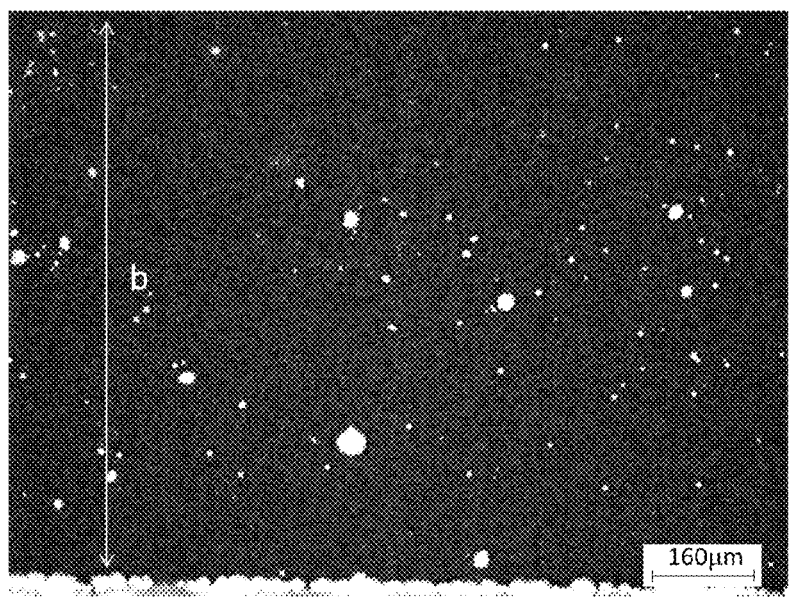
FIG. 7B is an optical micrograph showing a vicinity of an electroconductive layer in a solar cell of a Preparation Example.

Similarly to Preparation Example 1, a second insulating layer (silicon oxide layer) was deposited and annealed, and plating was performed at a current of 3 A/dm² to uniformly deposit copper on the insulating layer on the first electroconductive layer 71 as a second electroconductive layer 72 with a thickness of about 10 μm. Little copper was deposited onto a region where the first electroconductive layer was not formed. Thereafter, an excessive plating was performed similarly to Preparation Example 1, and resultantly deposition of copper in the vicinity of a first electroconductive layer-formed region was observed as shown in FIG. 7B.

Preparation Example 5

Figure 8B:
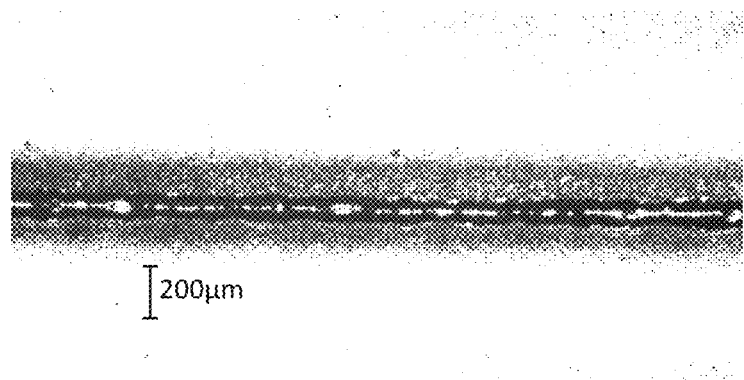
FIG. 8B is an optical micrograph showing a vicinity of an electroconductive layer in a solar cell of a Preparation Example.

In Preparation Example 5, a first electroconductive layer was formed using a paste having a binder resin content of 4 wt % similarly to Preparation Example 4, and then similarly to Preparation Example 2, a siloxane-based acryl resin was screen-printed using a screen plate with a negative pattern to the first electroconductive layer forming pattern, and cured to form a second insulating layer 92. Thereafter, copper was deposited as a second electroconductive layer 72 on the first electroconductive layer 71, and resultantly deposition of copper in the vicinity of the first electroconductive layer was observed. In FIG. 8B, the white part at the center is a region where copper is deposited on the first electroconductive layer, and the black part at the outer edge of the white part is a region where the second insulating layer has a small thickness. It is apparent that copper is also deposited on a part, where the insulating layer has a small thickness, in the vicinity of the first electroconductive layer-formed region.

Table 1 shows the resin content and viscosity of the electroconductive paste used in each of Preparation Examples 1 to 5, the line resistance and line width of the first electroconductive layer, the line width of the first insulating layer (exudation width of paste), and the method for formation of the second insulating layer and the material thereof. The viscosity is a value measured under conditions of a sample temperature of 25° C. and a spindle rotation speed of 4 rpm using a No. 14 spindle in a rotary viscometer Model HB manufactured by Brookfield.

TABLE 1

|  | Electroconductive paste | | First electroconductive layer | | First insulating layer | Second insulating layer | |
| --- | --- | --- | --- | --- | --- | --- | --- |
|  | Epoxy-resin content [wt %] | Viscosity [Pa · s] | Line resistance [Ω/cm] | Line width [μm] | Line width [mm] | Formation method | Second insulating layer |
| Preparation Example 1 | 5 | 202 | 0.08 | 105 | 0.5 | CVD whole surface deposition | SiO$_x$ |
| Preparation Example 2 | 5 | 202 | 0.08 | 105 | 0.5 | Screen printing | Acryl resin |
| Preparation Example 3 | 20 | 60 | 1.3 | 140 | 1.0 | CVD whole surface deposition | SiO$_x$ |
| Preparation Example 4 | 4 | 461 | 0.06 | 100 | 0 | CVD whole surface deposition | SiO$_x$ |
| Preparation Example 5 | 4 | 461 | 0.06 | 100 | 0 | Screen printing | Acryl resin |

In Preparation Example 1 and Preparation Example 2 where the content of the epoxy resin (binder resin) in the electroconductive paste used for formation of the first electroconductive layer was 5 wt %, and Preparation Example 3 where the content of the epoxy resin was 20 wt %, the epoxy resin exuded from the electroconductive paste coating region to form the first insulating layer. On the other hand, in Preparation Example 4 and Preparation Example 5 where the content of the epoxy resin was 4 wt %, the epoxy resin did not exude, and therefore the first insulating layer was not formed.

In Preparation Example 4 having no first insulating layer (FIG. 7B), copper was also deposited in the vicinity of the first electroconductive layer-formed region after excessive plating. On the other hand, it is apparent that in Preparation Example 1 where the second insulating layer was formed on the first insulating layer (FIG. 7A), and Preparation Example 3, the insulating layer in the vicinity of the first electroconductive layer (region a) had two layers, and therefore the capability of protection against a plating solution by the insulating layer was higher as compared to a portion where the second insulating layer was a single layer (region b). In Preparation Example 5 (FIG. 8B), copper was deposited in a region, where the second insulating layer had a small thickness, in the vicinity of the first electroconductive layer-formed region. On the other hand, in Preparation Example 2 (FIG. 8A), copper was not deposited in the first electroconductive layer-non-formed region.

From these results, it is apparent that in both a case where the second electroconductive layer is formed by a dry method (Preparation Examples 1 and 3) and a case where the second electroconductive layer is formed by a printing method (Preparation Example 2), the insulating material of the electroconductive paste exudes to form the first insulating layer, so that deposition of an undesired metal on the first electroconductive layer-non-formed region is suppressed.

In Preparation Example 3 where the content of the epoxy resin was 20%, the line resistance of the first electroconductive layer was 1.3 Ω/cm, and the resistance increased as compared to Preparation Examples 1 and 2. This is ascribable to a high resin content in the paste. In Preparation Examples 1 and 2, the line width of the first electroconductive layer was smaller by about 40 μm as compared to Preparation Example 3. This is ascribable to the fact that the content of the liquid resin was low, and the content of metal particles was relatively high, leading to an increase in viscosity of the electroconductive paste. Therefore, it is considered that by adjusting the resin content of the electroconductive paste, etc., the viscosity of the electroconductive paste can be adjusted to suppress an increase in line width of the first electroconductive layer and an increase in resistance, so that solar cell characteristics can be further improved.

As described above using Examples, according to the present invention, an insulating layer for protecting the photoelectric conversion section against a plating solution can be formed without necessity to perform strict patterning using a resist or the like. Since the insulating layer in the vicinity of the first electroconductive layer has a two-layer structure, deposition of an undesired metal is suppressed, so that a high-power solar cell can be provided at a low cost.

DESCRIPTION OF REFERENCE CHARACTERS

1 single-crystalline silicon substrate
2a, 3a intrinsic silicon-based thin-films
3a, 3b conductive silicon-based thin-films
6a, 6b transparent electrode layers
70 collecting electrode
71 first electroconductive layer
710 electroconductive fine particle
711 low-melting-point material
712 insulating material
713 high-melting-point material
72 second electroconductive layer 8 back side metal electrode
90 insulating layer
91 first insulating layer
92 second insulating layer
90h opening
92h opening section
50 photoelectric conversion section
101, 102 solar cell
105 heterojunction solar cell

The invention claimed is:

1. A production method of a solar cell, wherein
the solar cell comprising a photoelectric conversion section and a collecting electrode on a first principal surface of the photoelectric conversion section, and an insulating layer being provided in a first electroconductive layer-non-formed region on the first principal surface of the photoelectric conversion section where the first electroconductive layer is not formed,
the method comprising:
an electroconductive paste coating step of applying onto a first principal surface of a photoelectric conversion section an electroconductive paste containing electroconductive fine particles and an insulating material, and the insulating material exudes from an electroconductive paste coating region, thereby a coating layer consisting of a first electroconductive layer containing electroconductive fine particles and an insulating material and a first insulating layer that is in contact with an outer edge of the first electroconductive layer is formed; and
a plating step of forming a second electroconductive layer on the first electroconductive layer by a plating method, in this order, wherein
a width from a boundary between the first electroconductive layer and the first insulating layer to an end of the first insulating layer on the first principal surface of the photoelectric conversion section is 0.2 to 1.0 mm, and
after the electroconductive paste coating step and before the plating step, a second insulating layer forming step is carried out to form a second insulating layer covering at least a part of the first insulating layer.

2. The production method of the solar cell according to claim 1, wherein
in the second insulating layer forming step, the second insulating layer is not formed at least a part of the first electroconductive layer, thereby the second insulating layer has an opening section in a first electroconductive layer-formed region, and
in the plating step, the second electroconductive layer is deposited with the opening in the second insulating layer as an origination point.

3. The production method of the solar cell according to claim 1, wherein
in the second insulating layer forming step, the second insulating layer is also formed on the first electroconductive layer,
before the plating step, a step of forming an opening in the second insulating layer provided on the first electroconductive layer is carried out, and
in the plating step, the second electroconductive layer is deposited with the opening formed in the second insulating layer as an origination point.

4. The production method of the solar cell according to claim 3, wherein
the first electroconductive layer contains a low-melting-point material, and after the second insulating layer forming step, heating treatment is carried out at an annealing temperature Ta that is higher than a thermal-fluidization onset temperature $T_1$ of the low-melting-point material, thereby the opening is formed in the second insulating layer.

5. The production method of the solar cell according to claim 1, wherein a viscosity of the electroconductive paste is 50 to 400 Pa·s.

6. The production method of the solar cell according to claim 1, wherein
the photoelectric conversion section comprises: a silicon-based thin-film; and a transparent electrode layer, in this order on a first principal surface of a crystalline silicon substrate, and
the collecting electrode is formed on the transparent electrode layer.

7. A production method of a solar cell, wherein
the solar cell comprising a photoelectric conversion section and a collecting electrode on a first principal surface of the photoelectric conversion section, and an insulating layer being provided in a first electroconductive layer-non-formed region on the first principal surface of the photoelectric conversion section where the first electroconductive layer is not formed,
the method comprising:
an electroconductive paste coating step of applying onto a first principal surface of a photoelectric conversion section an electroconductive paste containing electroconductive fine particles and an insulating material, and the insulating material exudes from an electroconductive paste coating region, thereby a coating layer consisting of a first electroconductive layer containing electroconductive fine particles and an insulating material and a first insulating layer that is in contact with an outer edge of the first electroconductive layer is formed;
a second insulating layer forming step of forming a second insulating layer that covers the first electroconductive layer and at least a part of the first insulating layer;
a step of forming an opening in the second insulating layer provided on the first electroconductive layer; and
a plating step of forming a second electroconductive layer on the first electroconductive layer by a plating method, in this order, wherein
the first electroconductive layer contains a low-melting-point material, and
in the step of forming the opening, heating treatment is carried out at an annealing temperature Ta that is higher than a thermal-fluidization onset temperature $T_1$ of the low-melting-point material, thereby the opening is formed in the second insulating layer.

8. The production method of the solar cell according to claim 7, wherein a viscosity of the electroconductive paste is 50 to 400 Pa·s.

9. The production method of the solar cell according to claim 7, wherein
the photoelectric conversion section comprises: a silicon-based thin-film; and a transparent electrode layer, in this order on a first principal surface of a crystalline silicon substrate, and
the collecting electrode is formed on the transparent electrode layer.

* * * * *

UNITED STATES PATENT AND TRADEMARK OFFICE
CERTIFICATE OF CORRECTION

PATENT NO. : 9,553,228 B2  
APPLICATION NO. : 14/891636  
DATED : January 24, 2017  
INVENTOR(S) : Masashi Hino et al.

Page 1 of 1

It is certified that error appears in the above-identified patent and that said Letters Patent is hereby corrected as shown below:

On the Title Page

In item (57) for Abstract, at Line 10, insert --that-- between 'layer' and 'is'.

Signed and Sealed this
Twenty-first Day of March, 2017

Michelle K. Lee
*Director of the United States Patent and Trademark Office*